United States Patent
Nazarian

(10) Patent No.: US 12,154,624 B2
(45) Date of Patent: Nov. 26, 2024

(54) DIFFERENTIAL PROGRAMMING OF TWO-TERMINAL MEMORY WITH PROGRAM DETECTION AND MULTI-PATH DISABLEMENT

(71) Applicant: Crossbar, Inc., Santa Clara, CA (US)

(72) Inventor: Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 17/710,858

(22) Filed: Mar. 31, 2022

(65) Prior Publication Data

US 2023/0317162 A1  Oct. 5, 2023

(51) Int. Cl.
*G11C 11/00* (2006.01)
*G11C 13/00* (2006.01)
*H03K 19/17768* (2020.01)

(52) U.S. Cl.
CPC ...... *G11C 13/0069* (2013.01); *G11C 13/0026* (2013.01); *G11C 13/0028* (2013.01); *G11C 13/0038* (2013.01); *G11C 13/004* (2013.01); *H03K 19/17768* (2013.01)

(58) Field of Classification Search
CPC ............ G11C 13/0069; G11C 13/0026; G11C 13/0028; G11C 13/0038; G11C 13/004; H03K 19/17768
USPC ......................................................... 365/148
See application file for complete search history.

(56) References Cited

U.S. PATENT DOCUMENTS

| | | | | |
|---|---|---|---|---|
| 7,006,373 | B2* | 2/2006 | Hidaka | G11C 7/065 365/171 |
| 7,672,155 | B2* | 3/2010 | Kim | G11C 11/1675 365/158 |
| 9,520,173 | B1* | 12/2016 | Baker, Jr. | G11C 11/16 |
| 10,692,575 | B1 | 6/2020 | Huang | |
| 12,080,347 | B1 | 9/2024 | Nazarian | |

(Continued)

FOREIGN PATENT DOCUMENTS

CN    114187945 A    3/2022

OTHER PUBLICATIONS

Notice of Allowance for U.S. Appl. No. 17/710,835 dated Oct. 18, 2023, 8 pages long.

(Continued)

*Primary Examiner* — Tha-O H Bui

(74) *Attorney, Agent, or Firm* — Wegman Hessler Valore

(57) ABSTRACT

Improved differential programming of multiple two-terminal memory cells that define an identifier bit is provided. Differential programming can apply a program cycle to multiple memory cells concurrently, detect a program event for one (or a first group) of the memory cells and disconnect all of the memory cells from a program supply voltage in response to detecting the program event. Moreover, disconnecting the memory cells can be accomplished prior to a duration of the program cycle, serving to mitigate an invalid data result for the identifier bit, as well as reduce power consumption associated with the differential programming. Circuits providing intrinsic suppression of a non-programmed memory cell(s) defining an identifier bit in response to programming of another memory cell (or group of cells) defining the identifier bit are included. Differential programming can reduce power consumption and mitigate or avoid invalid data results for an identifier bit.

20 Claims, 15 Drawing Sheets

(56) References Cited

U.S. PATENT DOCUMENTS

| | | | |
|---|---|---|---|
| 2007/0058425 A1* | 3/2007 | Cho | G11C 13/004 |
| | | | 365/163 |
| 2007/0247940 A1* | 10/2007 | Liaw | G11C 13/004 |
| | | | 365/208 |
| 2008/0137436 A1 | 6/2008 | Salter | |
| 2011/0299340 A1 | 12/2011 | Samachisa et al. | |
| 2012/0320658 A1 | 12/2012 | Wang et al. | |
| 2014/0269008 A1 | 9/2014 | Barker, Jr. | |
| 2014/0321193 A1 | 10/2014 | Park | |
| 2015/0269993 A1 | 9/2015 | Shieh et al. | |
| 2016/0133325 A1 | 5/2016 | Lan et al. | |
| 2016/0284403 A1 | 9/2016 | Navon et al. | |
| 2019/0287612 A1 | 9/2019 | Jin et al. | |
| 2021/0201997 A1 | 7/2021 | Yuh | |
| 2022/0036949 A1 | 3/2022 | Asnaashari et al. | |
| 2022/0084592 A1 | 3/2022 | Tamara | |
| 2022/0039309 A1 | 4/2022 | Lu et al. | |
| 2022/0375536 A1 | 11/2022 | Strachan et al. | |
| 2023/0138195 A1 | 5/2023 | Park et al. | |

OTHER PUBLICATIONS

International Search Report & Written opinion for International Patent Application No. PCT/US2023/065178, dated Jul. 24, 2024, 7 pages long.

Notice of Allowance for U.S. Appl. No. 17/710,835, dated Apr. 9, 2024, 10 pages long.

Non-Final Office action for U.S. Appl. No. 17/895,129, dated Apr. 26, 2024, 16 pages long.

Notice of Allowance for U.S. Appl. No. 17/710,809, dated May 24, 2024, 19 pages long.

Notice of Allowance for U.S. Appl. No. 17/895, 129, dated Sep. 5, 2024, 19 pages long.

Non-Final Office action for U.S. Appl. No. 17/895,129, dated September 519 2024, 15 pages long.

\* cited by examiner

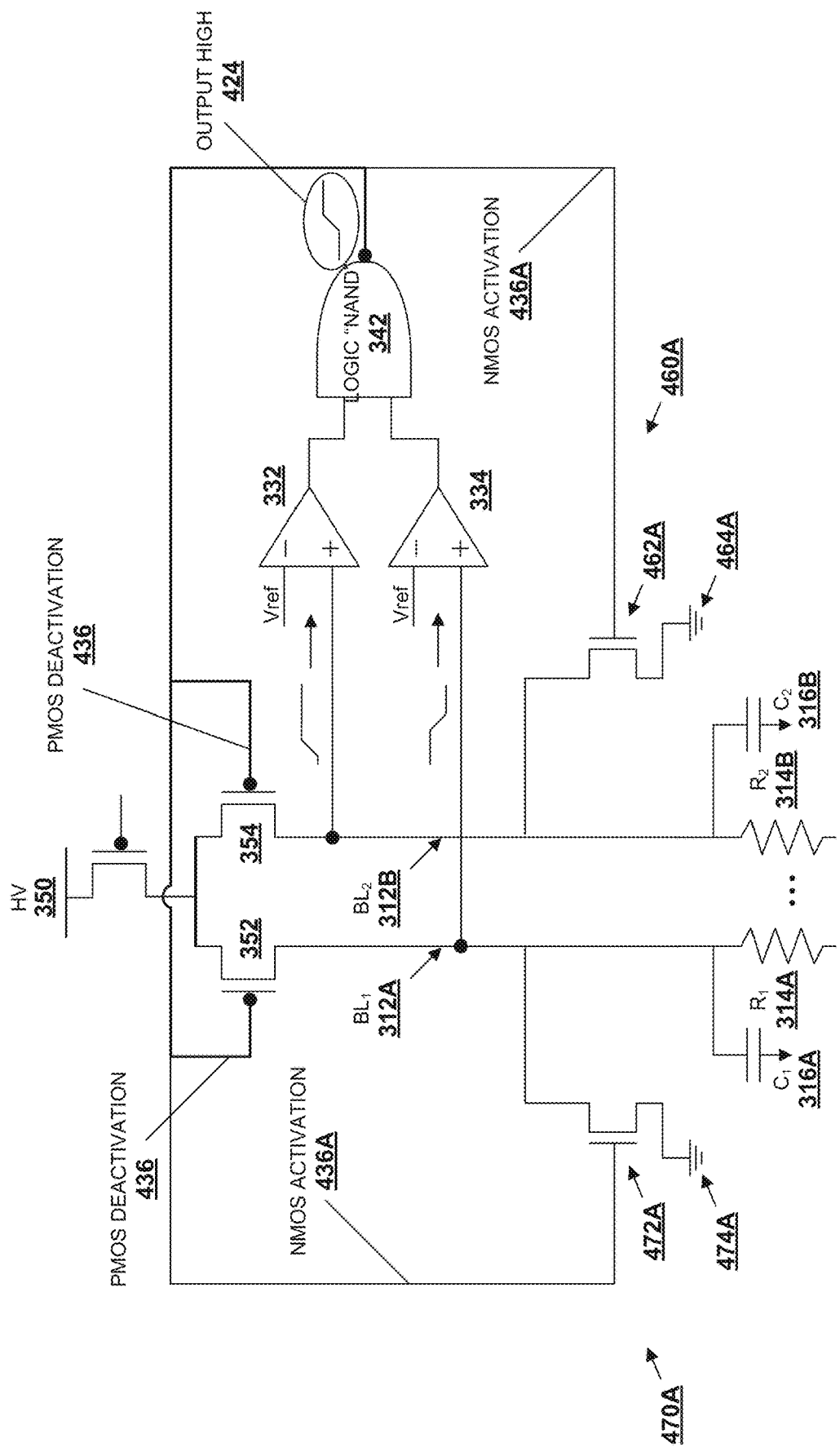

DIFFERENTIAL PROGRAMMING OF TWO-TERMINAL MEMORY WITH PROGRAM DETECTION AND MULTI-PATH DISABLEMENT

INCORPORATION BY REFERENCE

U.S. patent application Ser. No. 17/708,491 filed Mar. 30, 2022 and titled "DYNAMIC HOST ALLOCATION OF PHYSICAL UNCLONABLE FEATURE OPERATION FOR RESISTIVE SWITCHING MEMORY", U.S. patent application Ser. No. 17/710,809 filed Dec. 31, 2022 and titled "DIFFERENTIAL PROGRAMMING OF TWO-TERMINAL RESISTIVE SWITCHING MEMORY WITH INTRINSIC ERROR SUPPRESSION", and U.S. patent application Ser. No. 17/223,817 filed Apr. 6, 2021 and titled "DISTINCT CHIP IDENTIFIER SEQUENCE UTILIZING UNCLONABLE CHARACTERISTICS OF RESISTIVE MEMORY ON A CHIP" are hereby incorporated by reference herein in their respective entireties and for all purposes.

TECHNICAL FIELD

The subject disclosure relates generally to two-terminal memory devices, and as one illustrative example, differential programming of multiple two-terminal memory cells that detects a program event in one cell and disconnects the multiple cells from a voltage source.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

In additional to memory elements, volatile resistive-switching elements have been proposed in conjunction with a MOS transistor for a high speed non-volatile memory device, or as a high-speed field actuated switch, or selector device. Still further, stochastic characteristics of resistive-switching structures have been proposed by the inventor as suitable for generating non-correlated data for random number generation, or similar applications. Each of these applications has met different needs for electronic memory applications or specialty data generation applications.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide improved differential programming of multiple two-terminal resistive switching memory cells that define a single identifier bit. The disclosed differential programming can apply a program cycle to multiple memory cells concurrently, detect a program event for one (or a first group) of the memory cells and disconnect all of the memory cells from a program supply voltage in response to detecting the program event. Disconnection of the memory cells can be accomplished prior to a duration of the program cycle, serving to mitigate an invalid data result for the identifier bit, as well as reduce power consumption associated with the differential programming. In some embodiments disclosed herein, differential programming can provide intrinsic suppression of a non-programmed memory cell(s) defining an identifier bit in response to programming of another memory cell (or group of cells) defining the identifier bit. The intrinsic suppression can be very rapid, and greatly mitigate or avoid the invalid data result for the identifier bit. Further, the disconnection from the program supply voltage can be implemented in conjunction with the intrinsic suppression of the non-programmed cell(s), in various embodiments.

In an embodiment, disclosed is a method for programming a plurality of two-terminal resistive switching memory devices that define an identifier bit. The method can comprise connecting a first terminal of a first two-terminal resistive switching memory cell to a voltage source by way of a first switch, and connecting a first terminal of a second two-terminal resistive switching memory cell to the voltage source by way of a second switch. In an embodiment, the first two-terminal resistive switching memory cell and the second two-terminal resistive switching memory cell can define an identifier bit. In further embodiments, the method can comprise connecting second terminals of the first two-terminal resistive switching memory cell and of the second two-terminal resistive switching memory cell to low voltage and applying a program voltage at the voltage source for a duration of a program cycle. Still further, the method can comprise detecting a program event for the first two-terminal resistive switching memory cell or for the second two-terminal resistive switching memory cell. In addition to the foregoing, the method can comprise opening the first switch and opening the second switch to disconnect the first two-terminal resistive switching memory cell and the second two-terminal resistive switching memory cell from the voltage source in response to detecting the program event and before completing the duration of the program cycle.

In one or more additional embodiments of the present disclosure, provided is a method for programming a data bit defined by a plurality of two-terminal resistive switching memory cells. The method can comprise connecting first terminals of the plurality of two-terminal resistive switching memory cells to a voltage source, and can comprise connecting second terminals of the plurality of two-terminal resistive switching memory cells to a low voltage, or ground. Further, the method can comprise applying a program voltage at the voltage source concurrently for all of the plurality of two-terminal resistive switching memory cells for a duration of a program cycle, and can comprise detecting a programming event for one of the plurality of two-terminal resistive switching memory cells. Additionally, the method can comprise disconnecting the voltage source from the first terminals of the plurality of two-terminal resistive switching memory cells in response to detecting the programming event and before the duration of the program cycle.

Further embodiments of the present disclosure provide an integrated circuit device. The integrated circuit device can comprise an array of two-terminal resistive switching memory cells, which can further comprise a first two-terminal resistive switching memory cell having a first terminal and a second terminal, and a second two-terminal resistive switching memory cell having a first terminal and a second terminal. Additionally, the array can comprise a first bitline connected to the first terminal of the first two-terminal resistive switching memory cell, and can comprise a second bitline electrically connected to the first terminal of the second two-terminal resistive switching memory cell. Still further, the array can comprise a switching circuit electrically coupled to the second terminal of the second two-terminal resistive switching memory cell and to the second terminal of the first two-terminal resistive switching memory cell, and can comprise a wordline for selectively activating or deactivating the switching circuit. In addition to the above, the integrated circuit device can comprise a voltage source selectively coupled to the first bitline through a first transistor and to the second bitline through a second transistor, and can comprise a low voltage, or ground selectively coupled with the switching circuit in response to activation of the switching circuit by the wordline. Moreover, the integrated circuit device can comprise array control circuitry configured to detect a change in voltage on the first bitline or a change in voltage on the second bitline in comparison to a reference voltage, and can comprise an array controller. In one or more embodiments, the array controller can be configured to define the two-terminal resistive switching memory cell and the second two-terminal resistive switching memory cell as a single identifier bit, and implement a differential program for the single identifier bit. Moreover, the array controller can be configured to detect a program event at the first bitline or at the second bitline utilizing the array control circuitry in response to the differential program, and can be configured to disconnect the first bitline and the second bitline from the voltage source in response to detecting the program event.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 4A depicts a schematic diagram of a sample circuit for differential program detection and power disconnection, and bitline pull-down in further embodiments.

DETAILED DESCRIPTION

Introduction

Figure 1:
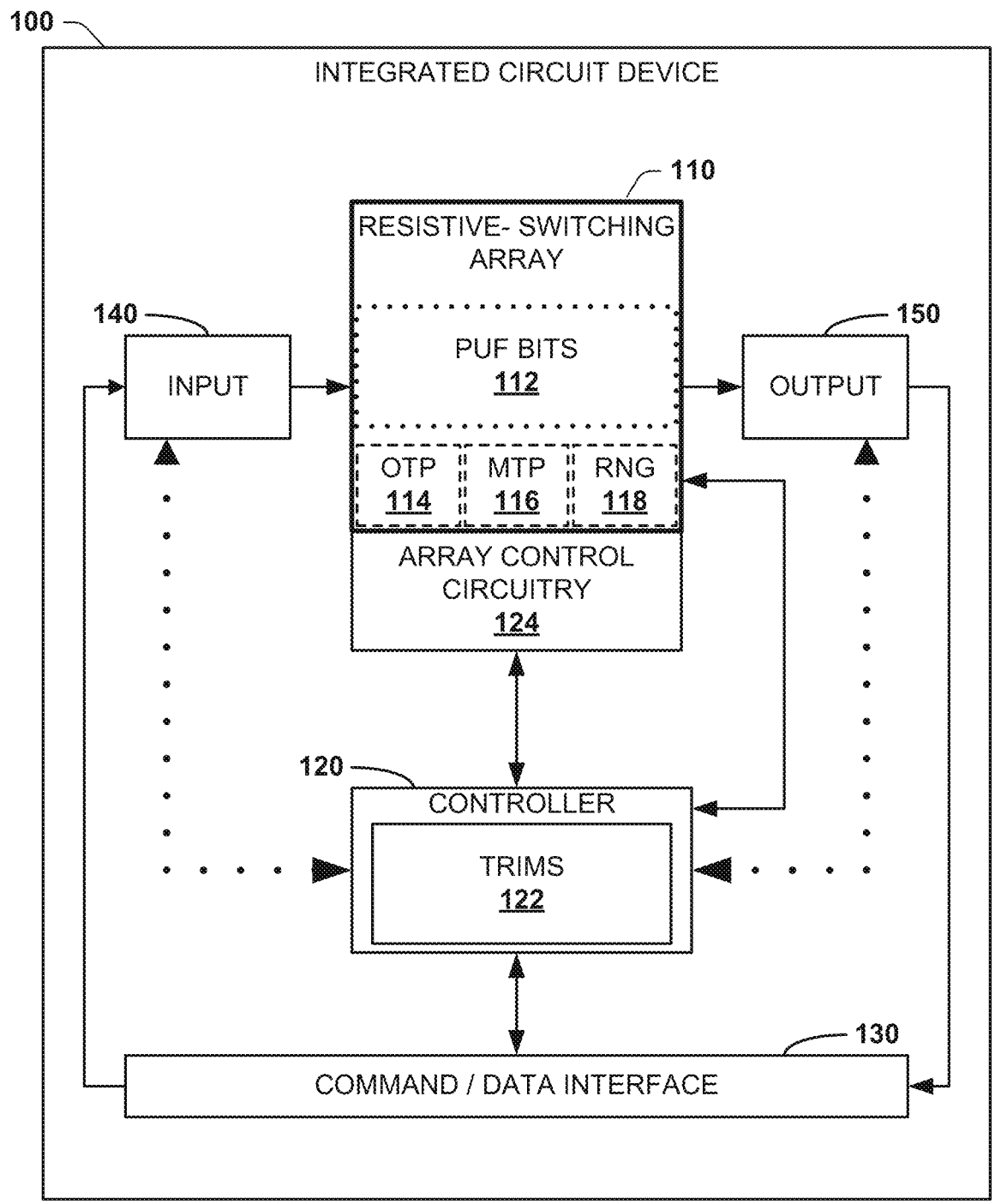
FIG. 1 depicts a block diagram of an example integrated circuit device and array of two-terminal resistive memory configured for differential programming, in an embodiment(s).

One or more embodiments of the present disclosure leverage stochastic or substantially stochastic physical characteristics of nano-scale resistive switching devices to generate data. Being generally random, stochastic features of resistive switching devices can be leveraged to produce data that has little to no correlation among a population of such devices. As a result, that data can be suited to applications requiring distinct or unique identification, such as identification and authorization applications pertaining to a device (e.g., a semiconductor die—also referred to herein as a semiconductor chip—or a semiconductor wafer, group(s) of dies, group(s) of wafers, an electronic device incorporating a semiconductor die(s), and so forth). Further, highly non-correlated data can also be utilized for security applications, such as random number generation, cryptography key generation applications, and the like.

In addition, various embodiments disclose resistive switching device processes utilized to generate high-entropic data sequences that meet or exceed scientific standards for randomness, and are comparable with high-quality cryptographic random number sources. In some embodiments, the switching device processes utilized to generate data sequences can be selected from native resistive switching devices (e.g., devices that have not previously been programmed, and are original or virgin devices post-fabrication) that most closely leverage nano-scale unclonable physical characteristics of the resistive switching devices. In other embodiments, switching device processes can be selected from resistive switching devices having low cycle count (e.g., less than a dozen program-erase cycles, less than a few hundred program-erase cycles, less than a few thousand program-erase cycles, and so forth), particularly for random number generation (RNG) with good randomness but not requiring highest-quality entropy utilized for cryptography. In general, leveraging physical characteristics of resistive switching devices achieves high non-correlation among devices on a die (intra-die), among dies on a wafer (inter-die) and among wafers in a fabrication facility, minimizing likelihood that a data sequence generated from resistive switching devices on a single die is repeated by other devices on that same die, or repeated by other resistive switching devices on a given wafer, or on different wafers, and so forth.

Some disclosed embodiments propose aggregation of multiple memory cells to define a single bit: also called an identifier bit, a differential bit, and the like. Program processes to generate data for an identifier bit defined by multiple cells are disclosed herein, and referred to generally as differential program processes. In some embodiments, a differential program process applying a program cycle concurrently to all memory cells defining an identifier bit is provided. In various disclosed aspects of such embodiments, differential programming can include detection of a program event(s) for one (or a group) of the memory cells and disconnection of the multiple cells from supply voltage. Other aspects include intrinsic suppression of non-programmed memory cells in response to a program event for one (or a group) of the memory cells. These aspects can mitigate or avoid invalid data results for differential programming, as well as reduce power consumption as described in more detail herein.

More generally, stochastic physical characteristics can also be referred to as physical unclonable functions (PUF), physically unclonable features (also PUF), physical(ly) unclonable features, or other suitable nomenclature. Data derived from such stochastic physical characteristics are referred to herein as PUF data (or a PUF bit, or group of PUF bits, etc.) and generally involve a resistive switching cell process applied to one or more resistive switching cells that define a PUF bit(s) (e.g., see U.S. patent application Ser. No. 17/223,817 filed Apr. 6, 2021, incorporated by reference hereinabove). PUF data can be generated from a cell process(es) applied to native resistive switching memory cells (sometimes referred to as virgin resistive switching memory cells) that have not had a memory process previously applied to those memory cells, following manufacture. Example memory processes can include a forming process (e.g., comprising one or more electrical forming pulses), a program process (e.g., comprising one or more electrical program pulses), an erase process (e.g., comprising one or more electrical erase pulses), an overwrite process, and so forth. In addition, PUF data generated from non-volatile resistive switching memory cells can thereafter be stored and read from at least a subset of the non-volatile resistive switching memory cells utilized to generate the PUF data.

Resistive switching memory cells suitable for generating identifier data, including PUF data, but also random number generation (RNG) data, as well as one-time programmable (OTP) data and many-time programmable (or re-programmable, overwritable, etc.) (MTP) data, include two-terminal resistive switching memory cells. Such two-terminal resistive switching memory cells can include: filamentary resistive switching memory (ReMEM), resistive random access memory (RRAM®), phase change memory (PCRAM), conductive-bridging memory (CBRAM®), programmable metallization cell memory (PMC), as well as magnetic memories such as magneto resistive memory (MRAM), spin torque transfer magneto resistive memory (STT-MRAM), vertical transport magneto resistive memory (VMRAM), ferroelectric memory (FeRAM), or other suitable two-terminal charge storage memory(ies). Where suitable to one of ordinary skill in the art, the foregoing memory technologies, like memory technologies, or suitable subsets thereof are considered within the meaning of two-terminal resistive switching memory for one or more embodiments of the present disclosure.

In one or more additional embodiments, some disclosed sequence generation processes can be rendered permanent through one-time programmable processes, allowing a sequence to be reliably re-read over a very large number of read cycles to reliably and accurately reproduce a previously generated data sequence, achieving extremely low bit error rates. In still further embodiments, disclosed processes for generating non-correlated data sequences can involve processes compatible with resistive switching device operation, allowing a set of resistive switching devices to be selected post-fabrication from any suitable subset of resistive switching devices on a chip. Systems and methods are further provided to export control of resistive switching device selection, data sequence process selection and process configuration —associated with physically unclonable data sequence generation disclosed herein—to a user of the chip post-fabrication. Various other embodiments will be readily apparent based on the disclosure herein and the associated drawings.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one of ordinary skill in the art, or a reasonable variation of a specified quality(ies) or quantity(ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (A), the relative term "about" can mean reasonable variances about 50 A that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality(ies) or quantity(ies) that would be suitable to accomplish an explicitly disclosed function(s) or feature(s) of a disclosed element. Accordingly, the subject specification is by no means limited only to specific qualities and quantities disclosed herein, but includes all variations of a specified quality(ies) or quantity(ies) reasonably conveyed to one of ordinary skill in the art by way of the context disclosed herein.

Integrated circuit techniques for fabricating resistive switching memory can cause physical properties having the stochastic or substantially stochastic characteristics desired for generating PUF data. For instance, these physical properties can have little or no replication or repetition among fabricated memory cells made by the same process. As one example, one or more layers of a disclosed resistive switching device can have a root mean square (RMS) surface roughness of >0.2 nm, up to a maximum of about 10.0 nm surface roughness, in an embodiment. This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching devices properties such as: native or virgin (e.g., as fabricated) current conductance, program voltage, differential program voltage, program speed, differential program speed, among others disclosed throughout this specification. As further examples, different resistive-switching memory cells and cell technologies can have different discrete programmable resistances, different associated program/erase voltages, as well as other differentiating characteristics. In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve stochastic physical characteristics disclosed herein. In other embodiments, a 22 nm photolithographic process producing a device size between 40 nm and 100 nm width (e.g., about 44 nm width, about 60 nm width, about 66 nm width, about 88 nm width, and so forth) can achieve stochastic physical characteristics.

In addition to the foregoing, stochastic physical features of resistive switching devices can vary among devices in a die and among devices on a wafer or multiple wafers. As a result, minimal correlation in the native physical features among devices, dies, wafers and so forth, can yield minimal correlation between operational processes and data derived from such processes among devices, dies, wafers and the like. For instance, a native electrical resistance of a resistive switching layer (RSL) can depend at least in part on these non-correlated physical features and can vary from device to device even for adjacent devices in a single array on a single die (and, as previously stated, among multiple dies, wafers, and so on). Further, a current flow through the RSL in a native un-programmed state, a program voltage in the native un-programmed state, a program speed in the native un-programmed state, differential program voltage/current/speed in the native un-programmed state, and so on, can vary among resistive switching devices. Processes disclosed herein for forming resistive switching devices and for leveraging stochastic or substantially stochastic physically unclonable features of resistive switching devices can provide excellent non-correlated data sequences.

As utilized herein, the term "native", "original", "virgin" or the like refers to post-fabrication but pre-commercial operation of resistive switching devices on a semiconductor die. Native (and like terminology) need not exclude some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory within an array of resistive switching memory; see e.g., FIG. 1, infra), among others. In general, a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., SiON, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. Pat. No. 9,633,724 B2 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum(Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: $0<x<2$, $0<x<3$, $0<x<4$ or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_yAlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein—such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art. Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In some disclosed embodiments, completion of a conductive filament can involve only a few particles (e.g., atoms, ions, conductive compounds, etc.) of conductive material, or less. As one particular example, an electrically continuous conductive filament could be established by position of 1-3 atoms at a boundary of a switching layer, whereas repositioning of one or more of these atoms can break that electrical continuity, in some embodiments. Because the scale is so small between a completed filament and non-completed filament, illicit side-channel attempts to read bits of memory—for example through high intensity microscopy—can be very difficult, if not impossible due to the difficulty of imaging such small particles and determining whether their location is sufficient to establish electrical continuity. Still further, disclosed resistive switching devices can be formed among metal lines of a semiconductor chip (e.g., among backend-of-line wiring layers). The density of metal wiring layers further occludes visibility of the resistive switching devices, making common side-channel techniques unprofitable.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

Overview

FIG. 1 illustrates a block diagram of an example integrated circuit device 100 for an electronic device according to one or more embodiments of the present disclosure. Integrated circuit device 100 includes an array(s) 110 of two-terminal resistive-switching memory cells (though other magnetic switching or charge-trapping two-terminal memory cells can be utilized instead or in addition, as described herein or known in the art). Array(s) 110 of memory can include resistive switching memory cells, and different portions of the resistive switching memory cells can be characterized (and re-characterized, where suitable) for different memory cell functions. Example memory cell functions can include physical identifier functions (e.g., physical unclonable feature (PUF), random number generation (RNG)), one-time programmable (OTP) functions and many-time programmable (MTP) functions (also referred to as rewritable or program/erase functions). Different groups of memory cells of array(s) 110 are provided (or can be characterized) to implement these functions. As described herein, identifier functions can be implemented by way of multiple resistive-switching memory cells collectively defined as an identifier bit (or by single cells defining a bit in some embodiments). Thus, depicted in FIG. 1 are PUF memory bits 112, RNG memory bits 118, OTP memory cells 114 as well as MTP or reversibly programmable memory cells 116. Array(s) 110 of resistive-switching memory cells can be characterized for other types of memory cell functions not specifically depicted in FIG. 1, where suitable.

Although array(s) 100 of resistive-switching memory cells illustrates designated sections of characterized memory cells, no spatial orientation, relative or absolute, is implied by the position of the dotted blocks within array(s) 110 of memory identifying PUF, OTP, MTP, or RNG data. Further, array(s) 110 of resistive-switching memory cells can be uncharacterized (e.g., upon initial fabrication), re-characterized (e.g., in response to re-characterization of cells from RNG to MTP, from MTP to OTP, and so forth), or de-characterized (e.g., removing previous characterizations, where suitable), or the like, as suitable. Accordingly, the characterization of memory cells in array(s) 110 is illustrative only, and array(s) 100 can be wholly uncharacterized, have some of the disclosed characterizations, and so forth.

In at least one alternative or additional embodiment(s), some memory cells of array(s) 110 of two-terminal resistive-switching memory cells can have a fixed size or number of memory cells located within a group of addresses of array(s) 110 of memory pre-assigned to one operational characteristic (e.g., MTP operation, OTP operation, RNG operation, PUF operation, or the like). Some or all of these pre-assigned memory cells could be re-characterized by controller 120 in some aspects of the disclosure, although some pre-assigned memory cell characterizations can be permanent and not re-characterizable in at least one aspect, and depending on design choice. In such embodiments, a host command received by a controller 120 identifying addresses of target memory cells can imply an operation consistent with the pre-assigned operational characteristic associated with those addresses. As an example, a write command targeting memory cell addresses pre-assigned to PUF operational characterization can imply a PUF write command, and so forth. When implementing the write command on memory cells pre-assigned to PUF operation, controller 120 can implement instructions suitable for a PUF write, rather than an MTP write, OTP write, or even a RNG write, as an example. In other embodiments, even where some memory cells of array(s) 110 are pre-assigned a characterization, other memory cells can be un-characterized, and can instead be assigned an operational characterization selected by an end user (or an external host device), where suitable, or can even be dynamically characterized or re-characterized as described herein.

In a general sense, identifier memory functions as utilized herein can refer to memory utilized to generate, store or operate in a fashion to generate uncorrelated data, generally understood to be suitable for distinguishing one set of identifier data from another set of identifier data. As noted supra, specific examples of identifier memory can include resistive switching cells characterized to operate as PUF memory, RNG memory, or the like. Other resistive-switching memory cells of array(s) 110 can be characterized as OTP memory or MTP memory, as illustrated.

In some disclosed embodiments, one or more of: PUF bits 112, OTP bits 114, MTP bits 116 and RNG bits 118 can be separate memory structures from array(s) 110 of memory (e.g., located externally to array(s) 110 on a semiconductor chip) or can be at least in part included within array(s) 110 of memory (e.g., an array among a set of arrays that embody array(s) 110 of memory, a block of memory within such an array(s) 110, a set of pages within one or more blocks or arrays, or other suitable arrangement).

Figure 11:
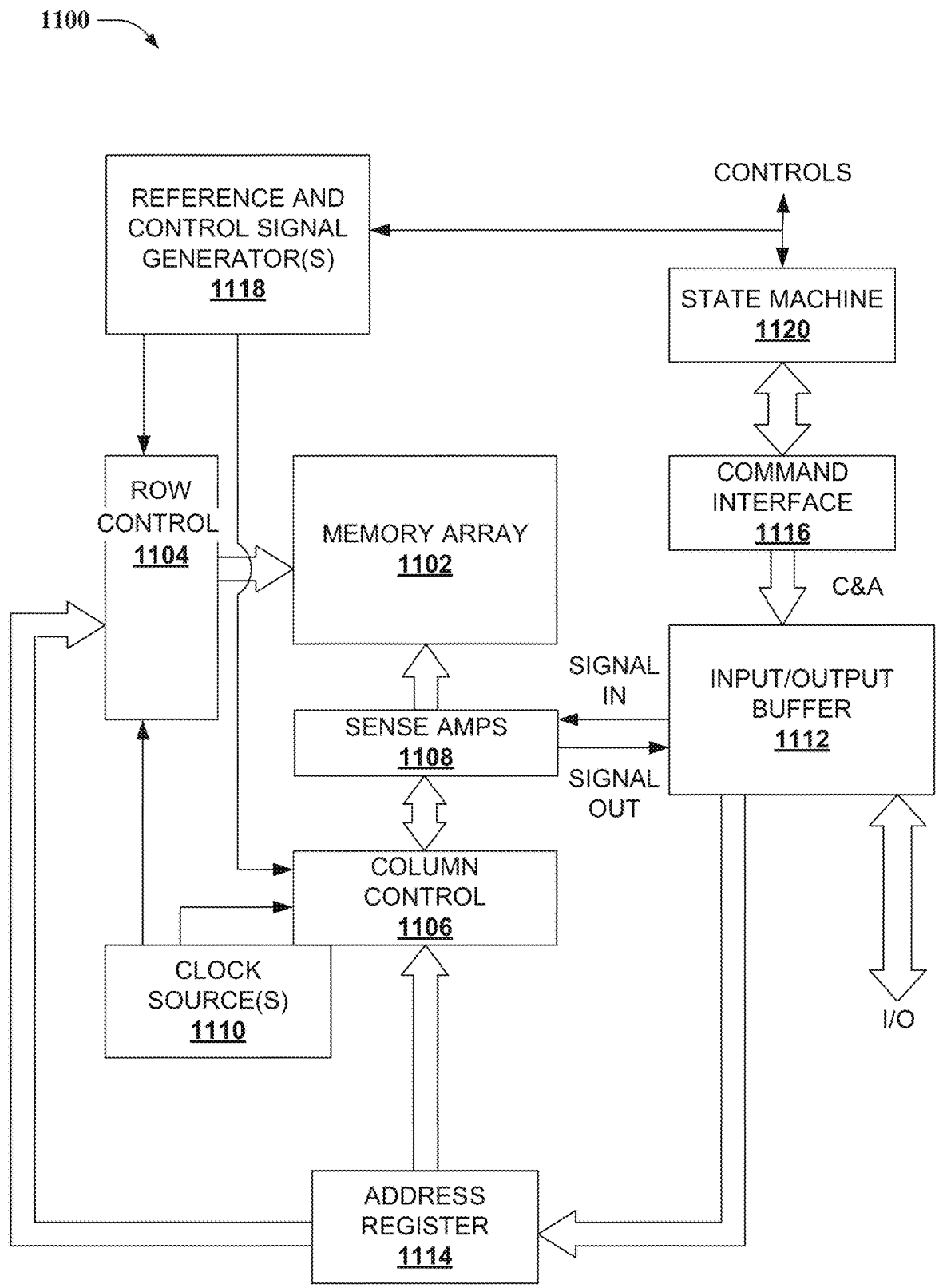
FIG. 11 illustrates a block diagram of an example electronic operating environment in accordance with one or more disclosed embodiments.

Controller 120 is provided to implement memory operations upon array(s) 110 of resistive-switching memory cells (e.g., see also FIG. 11, infra). Memory operations can include processes such as program (write), read, overwrite, erase, and so forth, operations suitable for operation of MTP bits 116. Memory operations can also include processes for program (write) or reading OTP bits 114. Instructions for implementing memory operations according to the various characterizations can be stored in trim instructions 122. Additionally, controller 120 can be configured to characterize different memory cells of array(s) 110 according to a disclosed function: an OTP characterization, an MTP characterization, a RNG characterization, a PUF characterization, or the like, or a suitable combination of the foregoing. Characterization of memory cells can be implemented in response to explicit memory characterization protocols (by way of command/data interface 130, for example), which can be implemented by a manufacturer post-fabrication of integrated circuit device 100, by a distributor or reseller of integrated circuit device 100 after fabrication, by an end-user as part of a chip calibration routine, or as a dynamic process during operation of integrated circuit device 100, or even in response to a host-generated memory command or memory cell characterization command, according to various embodiments. As an illustrative example, a host device communicatively coupled to integrated circuit device 100 can issue a host command to generate PUF data; such a host command can include or imply a PUF characterization protocol on memory bits identified in the host command, or a command to characterize cells as PUF bits 112 can be received separate from a command to generate PUF data from those cells. In various embodiments, trim instructions 122 can store protocols to characterize memory cells according to PUF, RNG, MTP, OTP characterizations, as well as implement memory operations consistent with those characterizations.

Also illustrated in integrated circuit device 100 is an input(s) 140 and output(s) 150. In some embodiments, input(s) 140 can include (or provide a pathway for) data to be stored within array(s) 110 of two-terminal resistive-switching memory cells, such as MTP bits 116 or OTP bits 114. Output(s) 150 can output data stored within resistive switching devices of array(s) 110, including PUF bits 112 and RNG bits 118 as well as OTP bits 114 and MIT bits 116. In some embodiments, output(s) 150 can output data that results from computations utilizing data stored in PUF bits 112 (or RNG bits 118) or stored within MTP bits 116 or OTP bits 114 resulting from such computations, in further embodiments.

A command/data interface 130 is provided to receive memory commands from an external device and respond to those commands. Further, data to be written to array(s) 110 can be received by way of command/data interface 130, and data output from array(s) 110 can be provided over command/data interface 130. In at least some embodiments, controller 120 can dynamically expose selection and (re-)characterization of memory cells of array(s) 110 to an external host device (separate from integrated circuit device 100—not depicted) by way of command/data interface 130. In various example implementations, the external host device can be manufactured separately and communicatively interconnected by one or more network or device interfaces to command/data interface 130 to accomplish this embodiment(s).

In addition to the foregoing, disclosed resistive switching devices have excellent properties for generating identifier data sequences. Such properties include high entropy, which is suitable for generating random or substantially random numbers, low bit error rate (BER), inherent difficulty in reverse engineering or illicit side-channel data access, and fast sensing times. For example, a bit sequence of 128 or 256 identifier (e.g., PUF) bits can be formed from 128 or 256 resistive switching devices or 128/256 groups (e.g., pairs, etc.) of multiple such resistive switching devices (as described in differential identifier bit generation; see FIG. 2 infra). High randomness in generating identifier bits minimizes non-random patterns between bits (resistive switching devices/groups of such devices) of a sequence, mitigating or avoiding false rejection rates.

More specifically, bit error rates (BER)s of identifier data generated with disclosed resistive switching devices are extremely low compared to techniques for generating PUF with static random access memory (SRAM). This allows integrated circuit device 100 to generate highly non-correlated identifier bits without special BER-reducing circuitry permanently affixed to memory cells from which identifier data is generated. As a result, any native two-terminal resistive switching memory cell(s) can be utilized to generate PUF bits 112, and any suitable (low cycle count) two-terminal resistive switching memory cell(s) can be utilized to generate RNG bits 118. As a result, embodiments disclosed herein can utilize row and column selection circuitry (including multiplexers—not depicted—but see row control 1104 and column control 1106 of FIG. 11, infra) and processes associated with implementing read, write, erase and other memory operations on resistive switching devices (e.g., FIGS. 11 and 12, infra), and extend those circuitry and processes to generating or storing PUF data, RNG data, OTP data, MTP data, and so forth. In such embodiments, resistive switching devices utilized for MTP memory operations, identifier data or OTP storage need not be fixed on manufacture, and can be characterized or dynamically re-characterized by controller 120 in disclosed embodiments. Some technologies for generating PUF data cannot achieve these characteristics described for integrated circuit device 100, resulting in a technical advantage for integrated circuit device 100.

In one or more embodiments, controller 120 can be operable to perform memory operations on array(s) 110 of memory. For instance, controller 120 can be operable to perform sensing operations pertaining to generating an identifier data bit from one (or a group of) resistive switching device(s) operably characterized as PUF bits 112 (or RNG bits 118), in an embodiment(s). Examples of non-differential sensing operations pertaining to generating an identifier bit from a single memory cell can include: native current of a never-programmed resistive switching device in the context of PUF data (or leak current of an un-programmed device in the context of RNG data) in response to a sub-program voltage, native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, as described herein (or as described within U.S. application Ser. No. 17/223,817 incorporated by reference hereinabove). In general, however, these sensing operations can be digitized to generate PUF or RNG data by comparing a measured result of a sensing operation (native current in response to sub-program voltage, detection of program event in response to a program signal, speed or timing of program event, a voltage at which a device becomes programmed, and so forth) to a threshold value stored in trim instructions 122 of controller 120. Generation of PUF data usually involves never-programmed resistive switching memory cells, whereas generation of RNG data can involve never-programmed cells, or un-programmed cells with relatively low program counts (e.g., fewer than 10 program events; fewer than 50 program events; fewer than 100 program events; fewer than 1000 program events; or other suitable value, or any suitable value or range there between), although the subject disclosure is not strictly limited to these definitions.

As further examples, controller 120 can be operable to perform a program operation(s) pertaining to generating an identifier data bit utilizing an identifier memory cell(s) 112, 118 of array(s) 110 of memory. Examples of such program operations include applying a program voltage magnitude to a never-programmed (or un-programmed for RNG data) memory cell and determining whether the cell is programmed or not programmed in response to the selected program voltage magnitude (program voltage magnitude differentiation). The identifier data bit can be digitized by assigning a '1' if the cell is programmed, and '0' if not programmed (or vice versa). Further examples include applying a program signal of selected pulse duration to a never-programmed (or un-programmed) memory cell and determining whether the cell is programmed or not programmed after the selected pulse duration (program time differentiation). Similar to the previous example, the identifier data bit can be digitized by assigning a '1' if the cell is programmed, and '0' if not programmed (or vice versa). Another example includes applying a sub-program voltage to a never-programmed (or un-programmed) memory cell and determining whether a native (or leak) non-programmed current is above or below a preselected current threshold (native/leak current differentiation). The identifier bit can be digitized by assigning a '1' if native current is above the threshold and assigning a '0' if native current is below the threshold (or vice versa). Other examples or combinations of the foregoing known in the art or reasonably suggested to one of ordinary skill in the art by way of the context provided herein are considered within the scope of the present disclosure.

In still other embodiments, controller 120 can be configured to implement differential operations pertaining to generating an identifier bit from a plurality of resistive switching devices. Generally, differential operations compare response of one or more cells of a plurality of memory cells to a memory operation and digitize an identifier bit associated with the plurality of memory cells based on relative responses of the one or more memory cells. Differential operations usable to generate an identifier bit according to aspects of the present disclosure can include: differential program speed of a group of never (or un) programmed memory cells, differential native program voltage of the group of memory cells, differential native (leak) current of the group of memory cells, differential native electrical resistance of the group of memory cells, differential on-state resistance of the group of memory cells, differential erase voltage or current of the group of memory cells, differential delay frequency of the group of memory cells, differential parasitic resistance or capacitance of the group of memory cells, a differential program or erase minimum pulse width or duration of the group of memory cells, or the like, or a suitable combination of the foregoing. For differential operations, using the exemplary case of two cells per identifier bit (though the rule can be extended to three or more cells per identifier bit through proportional logic, optionally for generating multi-bit identifier data with suitable numbers of differential cells), the identifier bit can be digitized by assigning a '0' value to identifier bits in which a first memory cell has higher (or lower) native current/on-state resistance/erase voltage/delay frequency/parasitic resistance or capacitance/program or erase speed, etc., and assigning a '1' to identifier bits in which a second memory cell has the higher (or lower) native current/on-state resistance/erase voltage/delay frequency/parasitic resistance or capacitance/program or erase speed, and so forth. Rules for digitizing identifier bits utilizing differential operations on multiple memory cells can be stored in trim instructions 122, in an embodiment or elsewhere in controller 120 or integrated circuit device 100.

Embodiments of the present disclosure provide improved differential programming of multiple resistive switching memory cells that define an identifier bit. In one aspect of such embodiments, array control circuitry 124 is provided that can include a detection circuit to detect a program event(s) for a first of the multiple resistive switching memory cells (or a first group of such cells). Additionally, array control circuitry 124 can include a termination circuit configured to disconnect the multiple resistive switching memory cells from program voltage in response to detection of the program event(s). This disconnection from program voltage can occur prior to completion of a program cycle associated with the differential programming, as an example (see, for instance, FIGS. 3 through 5, infra). In at least some embodiments, array control circuitry 124 (or array(s) 110 itself) can include a common node connected to second terminals of the multiple resistive switching memory cells for the differential programming to facilitate intrinsic suppression of the second of the multiple resistive switching memory cells (or the second group of such cells) in response to the program event. The intrinsic suppression of un-programmed memory cells can be very rapid (e.g., less than 10 nanoseconds, ns), greatly mitigating unexpected program events for the differential programming of the identifier bit (e.g., see FIGS. 6 and 7, infra).

In yet other embodiments, controller 120 can be operable to selectively implement one-time programmable operations on selected PUF bits 112 to render permanent a PUF bit sequence generated with a program event at a set of PUF bits 112 (or, e.g., stored at a set of memory cells in response to generation at other memory cells by a non-program event, such as native leak current or the like). Described differently, a PUF data sequence comprising program and un-programmed bits can be reinforced with a strong program pulse, e.g., a one-time programmable pulse, to make program bits of the PUF data sequence non-erasable and create large sensing margin between the program bits and the un-programmed bits of the PUF data sequence. This can serve to greatly enhance longevity and accurate read cycle counts of the PUF bit sequence.

In still additional embodiments, controller 120 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on identifier memory cells 112, 118, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a '1' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a '0' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

It should be appreciated that a suitable threshold or set of thresholds can be established for other resistive switching device operational characteristics selected for generating identifier bit information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 120; in other embodiments default threshold settings can be set (optionally stored in trim instructions 122) upon initializing a semiconductor chip.

In addition to the foregoing, controller 120 can be configured to define an arrangement or ordering of resistive switching devices (or groups of resistive switching devices) to create a multi-bit sequence of identifier bits. As one illustrative example, resistive switching devices 0:7 can be read and assigned to bits 0:7 of a bit sequence. In an alternative embodiment—utilizing pairs of switching devices to a define an identifier bit—first resistive switching devices 0:7 in a block of array(s) 110 can be associated with second resistive switching devices (n: n+8) elsewhere in the block of the array(s) 110 (or in another block of the array(s) 110) by controller 120 to define identifier bits 0:7 of a (differential) bit sequence. The variable: n can be any suitable number greater than 7 if in the same block, or any number if in a different block or on a different wordline of the block. However, in particular embodiments the number n can be a multiple of the size of the bit sequence, e.g., for an 8-bit identifier sequence a multiple of n=8:8, 16, 24, 32, . . . , 128, 256, 512, and so forth. In other embodiments, the bit sequence need not be derived from resistive switching devices arrayed in a particular order (consecutive or otherwise). As an example, from an ordinal line of resistive switching devices, devices 15, 90, 7, 21, 50, 2, 37, 19 (and suitable associated groups of other resistive switching devices in the differential programming context, where multiple resistive switching devices define each identifier bit) can be read and respectively assigned to bits 0:7 of an output bit string. The bit string can be of any selected length, defined by a matching number of resistive switching devices (or multiples of the matching number in the differential context). For instance, bit strings of 64 bits, 256 bits, 1024 bits, 64 kbits, or any other suitable subset of identifier memory cells 112, 118 up to all of identifier memory cells 112, 118 (which can include all of array(s) 110 of memory in at least some embodiments) may be employed for a bit string. As another non-limiting illustration, for a 256-bit PUF data sequence utilized for a cryptographic key, controller 120 can characterize a set of memory cells as PUF bits and define an ordering of resistive switching memory cells assigned to the PUF bits to correspond with a sequence of 256 bits. Bit values (e.g., logic levels, . . . ) generated from the assigned resistive switching memory cells can then be ordered by controller 120 consistent with the device(s) ordering to thereby create the 256-bit identifier sequence. As a specific illustration: where a row of 256 resistive switching devices in an array is selected for generating an identifier sequence, identifier bit values of the 256 resistive switching devices can be arranged in the order the resistive switching devices are physically situated in the row; however, this is an illustrative example only and any other suitable arrangement or ordering can be implemented by controller 120 as an alternative or in addition.

In should be understood that operations, configurations, characteristics and various illustrations and descriptions of controller 120 can be applicable to other controllers disclosed herein in various embodiments (e.g., with reference to FIG. 11, infra, memory array 1102 and components of operating environment 1100 configured for control of operations of memory array 1102). Conversely, operations, configurations, characteristics and various illustrations and descriptions of other controllers disclosed herein can be applicable to controller 120 in one or more embodiments.

Although presented briefly above, and now in more detail: rules for establishing a subset of switching devices of array(s) 110 according to a disclosed operational characterization can be stored in trim instructions 122. Trim instructions 122 can comprise rules for storing operational characterizations of the available characterizations of resistive-switching memory cells of array(s) 110, rules for identifying (and storing) memory cell addresses having one of the specified characterizations, rules for performing operations upon characterized switching devices consistent with the characterization, and so forth. For instance, trim instructions 122 can store rules for characterizing one or more groups of resistive switching devices of array(s) 110 as PUF bits 112, rules for coupling multiple resistive switching devices to form differential PUF bits in some embodiments (e.g., see FIGS. 2, 3 and 5, infra), rules for performing a PUF operation on a group of resistive switching devices characterized as PUF bits 112, such as a PUF write (to generate PUF bits) or a PUF read (to read data generated with a PUF write and stored at cells generating the data, stored at a portion of the cells generating the data, or stored at other cells within array(s) of memory 110, according to various embodiments), and rules for re-characterizing resistive switching devices as OTP bits 114, MTP bits 116 or RNG bits 118 previously characterized as PUF bits 112, or as no characterization. Trim instructions 122 can likewise store rules for characterizing one or more groups of resistive switching devices as OTP bits 114, MTP bits 116 or RNG bits 118, rules for coupling multiple resistive switching devices to form differential RNG bits (e.g., in a similar manner as provided herein for differential PUF bits, extended to un-programmed memory cells with low write counts), rules for performing an OTP, MTP or RNG operation, and rules for re-characterizing OTP bits 114, MTP bits 116 or RNG bits 118 as other characterizations (where suitable), or no characterization (e.g., utilizing default or conventional trim instructions in at least one embodiment).

To implement operations on memory cells consistent with a previous characterization, controller 120 can reference saved characterizations for groups of memory cells (e.g., stored in trim instructions 122 or elsewhere on integrated circuit device 100, such as within array(s) 110 itself) and obtain from trim instructions 122 suitable signal characteristics for a memory operation consistent with the characterization. Suitable signal characteristics can include: a voltage magnitude(s), current compliance, signal duration, dynamic voltage pulse as a function of time, and so forth. For a PUF write, for instance, trim instructions 122 can store suitable signal characteristics for various PUF write modalities described herein (e.g., utilizing native current, native electrical resistance, detected program event(s), among others). Trim instructions 122 can also store suitable inhibition signals for memory cells neighboring a cell(s) being operated upon, a termination condition(s) for terminating an operation signal, among other signal operations employed for implementing memory operations or identifier operations on resistive switching devices as known in the art or described herein. Likewise, trim instructions 122 can store suitable signal characteristics, inhibit signal characteristics, termination conditions, and so forth, for other disclosed identifier bit sensing operations. Further, trim instructions 122 can store rules for aggregating multiple memory cells to form a differential identifier bit, for differential PUF or RNG memory operation, and for aggregating groups of multiple memory cells to create multiple differential identifier bits to generate a sequence of PUF data or RNG data. Other operational rules, configurations, settings and the like can be stored in trim instructions 122 as disclosed herein, as known in the art or as reasonably conveyed to one of ordinary skill in the art by way of the context disclosed herein. For instance, trim instructions 122 can specify a subset of multiple memory cells defining a PUF bit (e.g., one memory cell of a pair of memory cells defining the PUF bit; two memory cells of four memory cells defining the PUF bit, etc.) as storing a data value for the PUF bit generated in response to a differential program protocol.

Figure 2:
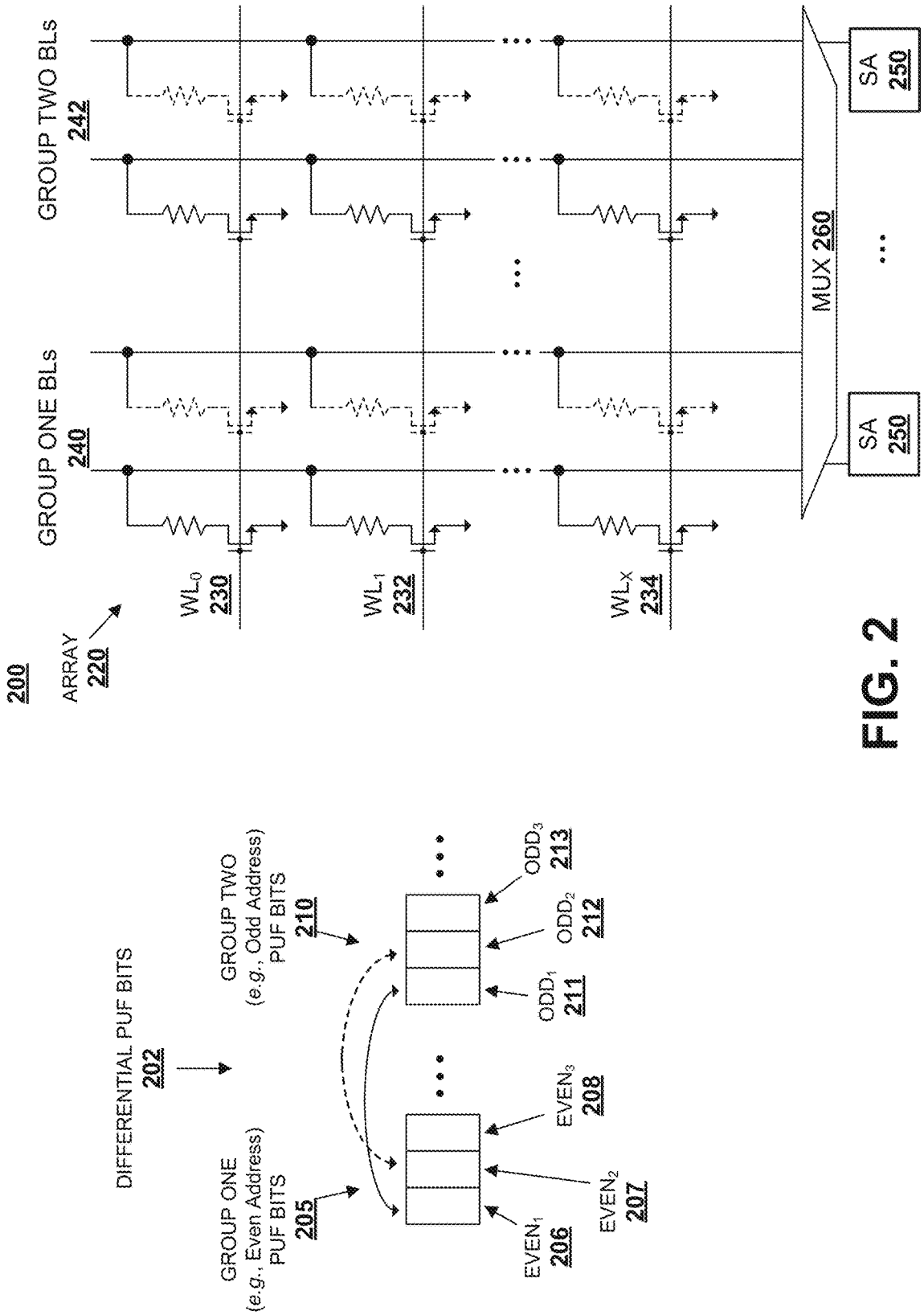
FIG. 2 illustrates a diagram of example arrangements of multiple memory cells that collectively define a single bit for differential programming, in further embodiments.

FIG. 2 illustrates a diagram of an example arrangement 200 of differential identifier bits according to alternative or additional embodiments of the present disclosure. Differential identifier bits can be utilized for generating PUF data or for generating RNG data, in various embodiments. On the left-side of FIG. 2 is an illustration of example groups of two-terminal resistive-switching memory cells (in this case, pairs) defining differential PUF bits 202 (also applicable to RNG bits). In the example differential PUF bits 202 illustrated by FIG. 2, a first group of memory cells on even bitlines of an array (e.g., array(s) 110, but see also array 220) are coupled with a second group of memory cells on odd bitlines of the array. Respective pairs of the memory cells from an even bitline and an odd bitline define a differential PUF bit 202, as described herein. It should be understood that the example of FIG. 2 is illustrative only, and not intended to limit the manner or arrangement in which a first memory cell from a first group of an array(s) (e.g., array(s) 110) can be combined with one or more additional memory cells from additional groups of the array(s) to define a differential PUF bit. For instance, the coupling of even and odd bitlines, though a serviceable example, is not intended to limit the creativity of one of ordinary skill in the art to define a differential PUF bit from two or more memory cells, whether on even bitline(s), odd bitline(s), a common wordline or different wordlines, or any other suitable location within an array(s). Rather, all disclosed examples as well as examples not explicitly disclosed but reasonably conveyed to one of ordinary skill by way of the context provided in the present disclosure are within the intended scope of a differential PUF bit 202.

In the example illustrated by FIG. 2, even address portions 205 of differential PUF bits 202 and odd address portions 210 of differential PUF bits 202 are shown. Although illustrated as blocks, the blocks of even and odd address portions 205, 210 represent (one or more) respective resistive switching cells of an array of resistive switching devices 220. The respective resistive switching cells can be the same or similar to cells 322, 324 of FIG. 3 or cells 522, 524 of FIG. 5 in some embodiments, whereas in other embodiments a resistive switching cell can have other arrangements of a resistive switching device and one or more transistors, as well as one or more other analog or digital circuit components suitable for a resistive switching cell known in the art or reasonably conveyed to one of ordinary skill in the art by way of the context presented herein, all of which are considered within the scope of the present disclosure.

Differential PUF bits 202 illustrate three PUF bits and respective even and odd memory cells forming the PUF bits.

Even cell$_1$ 206 and odd cell$_1$ 211 form a first PUF bit, even cell$_2$ 207 and odd cell$_2$ 212 form a second PUF bit, and even cell$_3$ 208 and odd cell$_3$ 213 form a third PUF bit. Array 220 illustrates an arrangement of wordlines and bitlines defining an array of multiple resistive switching cells according to some disclosed embodiments. Two differential PUF bits 202, as described above, can be defined from the memory cells illustrated on each wordline of array 220, but it should be understood that many more pairs of differential PUF bits 202 can be defined in an array that is not limited by drawing area constraints, as one of skill in the art would readily understand.

The wordlines include wordline$_0$ 230, wordline$_1$ 232 through wordline 234, where x is a suitable integer larger than 1, referred collectively as wordlines 230-234. Likewise, the bitlines include even bitlines 240 and odd bitlines 242. For an embodiment in which two memory cells define a differential PUF bit 202, a first PUF bit 202 can be defined (e.g., on a single wordline) and include a memory cell (e.g., even$_1$ 206) connected to one bitline of even bitlines 240 and a second memory cell (e.g., odd$_1$ 211) connected to one bitline of odd bitlines 242. A second PUF bit 202, can be defined by even and odd memory cells (e.g., even$_2$ 207 and odd$_2$ 212) on the same wordline (e.g., wordline$_0$ 230) adjacent to the memory cell and second memory cell, in an embodiment(s). In alternative embodiments, the second PUF bit 202 can be defined by memory cells that are on non-adjacent bitlines with respect to the memory cell and second memory cell, while still on the same wordline. In still other embodiments, the second PUF bit 202 can be defined by even and odd memory cells on a different wordline (e.g., wordline$_1$ 232). Moreover, any plurality of the PUF bit, second PUF bit, a third PUF bit (e.g., defined by even$_3$ 208 and odd$_3$ 213), or other PUF bits not depicted can form a PUF data sequence (or portion thereof) when on the same wordline in either adjacent or non-adjacent bitlines, or on different wordlines in adjacent or non-adjacent bitlines, or suitable combinations of the foregoing. In still other embodiments, a differential PUF bit can be defined from more than two memory cells of array 220. Where PUF bits of a data sequence reside on different wordlines, suitable inhibition circuitry or signal processes can be provided for array 220 to mitigate or avoid bit disturb effects on memory cells not associated with the data sequence, or PUF bits on a subset of bitlines or wordlines can be operated upon sequentially while inhibiting other portions of the bitlines and wordlines connected to one or more PUF bits, or a suitable combination of the foregoing.

Electrical response of a memory cell can be measured on a bitline connected to the memory cell. As depicted, one or more sense amps 250 can be selectively connected to or disconnected from even bitlines 240 and odd bitlines 242. In various embodiments, a multiplexer 260 or other switching device or circuit (e.g., transistor, or other switch) can electrically connect a sense amp 250 to even bitlines 240, and can connect a second sense amp 250 to odd bitlines 242. Sense amps 250 can be utilized to determine whether voltage or current on a connected bitline changes (e.g., voltage reduces, current increases, and so forth) in a manner indicating a program event has occurred for a memory cell coupled to that connected bitline. In one embodiment, sense amps 250 and multiplexer 260 can be instituted on a ground path for an array 220 (e.g., through transistors connected to wordline 320 in FIG. 3, infra) or sense amps 250 and multiplexer 260 can be instituted on a supply voltage and predetermined current path for the array 220 (e.g., through Viclamp transistors coupling bitlines 312A, B to program supply 310 of FIG. 3, or coupling bitlines 512A, B to program supply 510 of FIG. 5, infra). In at least one embodiment, multiplexer 260 can be a M×N multiplexer (where M and N are respective positive integers), where N can be a number of sense amps 250 and a number of groups of memory cells defining identifier bits for a bit sequence, and where M can be a number of bitlines coupled to the memory cells of the groups.

Figure 3:
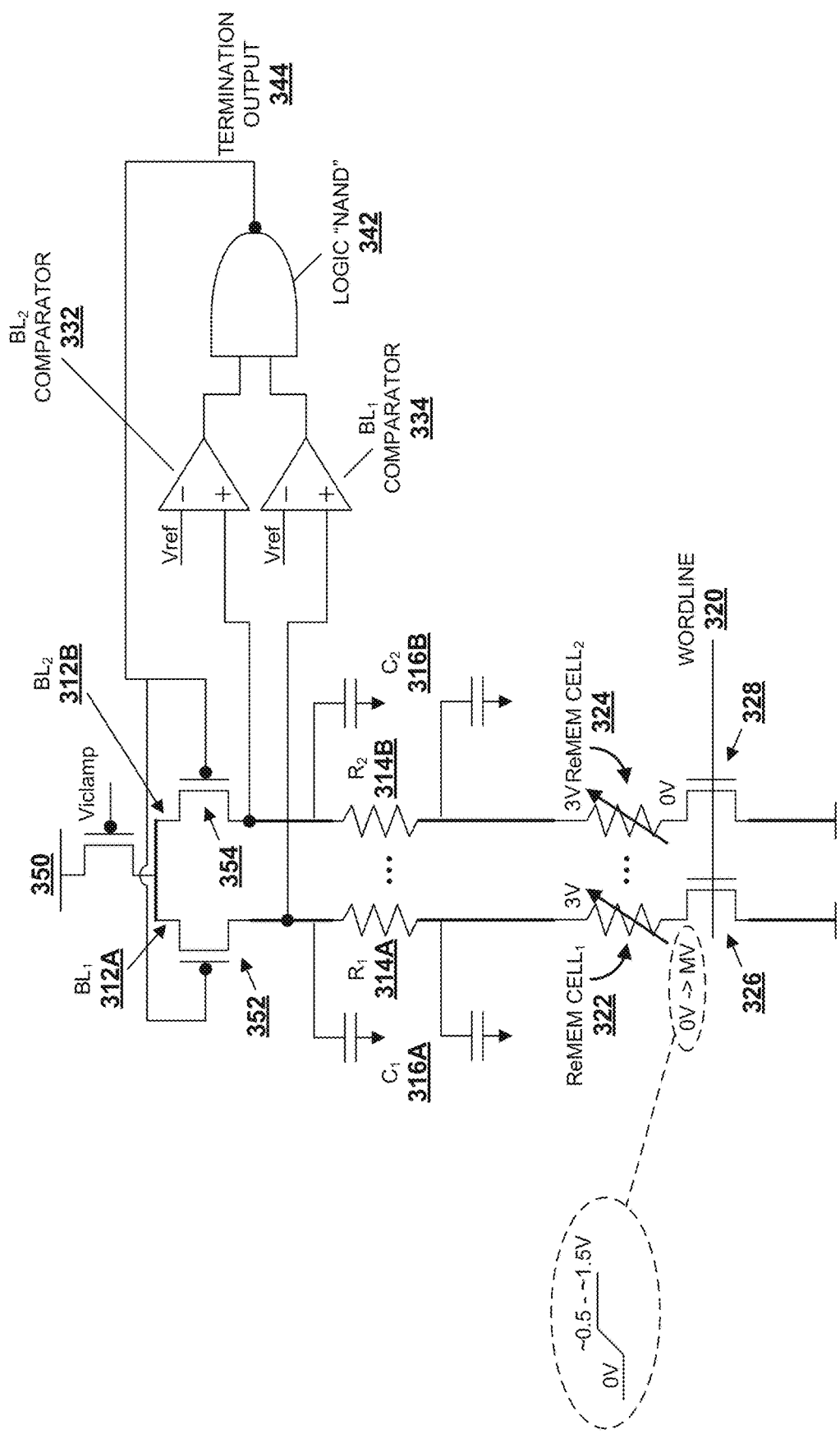
FIG. 3 depicts a schematic diagram of an example circuit for differential programming with program detection and multi path disablement, in additional embodiments.

FIG. 3 illustrates a schematic diagram of an example circuit 300 for implementing differential programming of two-terminal resistive switching memory cells, in various embodiments of the present disclosure. As illustrated, circuit 300 can incorporate program detection and program voltage termination for multiple two-terminal resistive switching memory cells defining an identifier bit. Circuit 300 can facilitate generation of differential data for the identifier bit—by programming of one (or one group) of memory cells and non-programming of another (or second group) of memory cells—while mitigating invalid data values for the identifier bit. For instance, by detecting a program event(s) for one or more memory cells defining the identifier bit, circuit 300 can disconnect the memory cells from a voltage source in response to the program event(s), even before a duration of a differential program cycle is complete. This helps to mitigate the likelihood of unexpected program results (e.g., an unexpected number of cells becoming programmed) that contravene rules for defining a value of the identifier bit. As a result, circuit 300 can reduce a likelihood of the differential program process producing an invalid data value for the identifier bit. In addition to the foregoing, by disconnecting the memory cells from the voltage source before completion of the program cycle, power consumption associated with the differential programming is reduced.

In more detail, and as described herein, a plurality of two-terminal memory cells can be aggregated to define an identifier bit. A differential program process can be applied to the memory cells to program one (or a first group) of the memory cells and avoid programming a second (or second group) of the memory cells. After programming, a read operation can be implemented to determine which memory cell(s) is programmed in response to the differential program process. Upon comparing the programmed cell(s) with digitization rules for differential programming stored by an integrated circuit device (e.g., stored within trim instructions 122), a data value for the identifier bit defined by the plurality of two-terminal memory cells can then be determined. For instance, where a first memory cell (e.g., ReMEM cell$_1$ 322) or group of such memory cells is programmed a digital '1' can be assigned to the data value for the identifier bit, whereas when a second memory cell (e.g., ReMEM cell$_2$ 324) or group of such memory cells is programmed a digital '0' can be assigned to the data value for the identifier bit (or vice versa in other examples). It should be appreciated that other rules for digitizing the data value can be implemented instead of the examples explicitly recited herein. Moreover, digitization rules and identifier data values for non-binary numbering are also within the scope of the present disclosure, and relative program states of the plurality of two-terminal memory cells defining a quaternary numbering system, octal numbering system, decimal numbering system, hexadecimal numbering system, or the like, can also be implemented in still additional embodiments of the subject disclosure. In general, however, where digitization rules anticipate fewer than all of the plurality of two-terminal memory cells becoming programmed to produce valid identifier data, circuit 300 can reduce invalid data results by detecting a program event(s), and disconnecting the memory cells from a voltage source to reduce unexpected program events.

In the embodiment(s) illustrated by FIG. 3, circuit 300 can comprise an identifier bit(s) defined by two (or more) two-terminal resistive switching memory cells, including: ReMEM cell$_1$ 322 and ReMEM cell$_2$ 324 (referred to hereinafter collectively as ReMEM cells 322, 324). Each ReMEM cell 322, 324 is connected at a respective first terminal to a bitline. As illustrated, ReMEM cell$_1$ 322 is connected to bitline$_1$ 312A and ReMEM cell$_2$ 324 is connected to bitline$_2$ 312B (referred to hereinafter collectively as bitlines 312A, B). Additionally, ReMEM cells 322, 324 are connected at respective second terminals to a switching circuit, which can selectively connect (or disconnect) the second terminals of ReMEM cells 322, 324 to low voltage, or ground. In the embodiment depicted by FIG. 3, the switching circuit includes a first transistor 326 connecting a second terminal of ReMEM cell$_1$ 322 to low voltage (or ground), and a second transistor 328 connecting a second terminal of ReMEM cell$_2$ 324 to low voltage (or ground). First transistor 326 and second transistor 328 can be activated or deactivated in response to voltage on a wordline 320 connected to respective gate nodes of first transistor 326 and second transistor 328, as shown. As shown by the schematic diagram of circuit 300, first transistor 326 provides a first electrical path to low voltage (or ground) for the second terminal of ReMEM cell$_1$ 322 and second transistor 328 provides a second electrical path to low voltage (or ground) for the second terminal of ReMEM cell$_2$ 324, and the first electrical path is electrically isolated from the second electrical path.

Although two memory cells and bitlines are illustrated in circuit 300, it should be appreciated that circuit 300 can comprise many more bitlines and many more memory cells, along with additional wordlines, as suitable for an array of two-terminal memory cells. For example, additional bitlines and memory cells within a row of the array can be provided to the left of bitlines 312A, B (as illustrated), between bitlines 312A, B, or to the right of bitlines 312A, B. As another example, additional rows of bitlines and memory cells can be provided below wordline 320, or above wordline 320 according to the orientation of FIG. 3. Still further, multiple two-dimensional layers of bitlines, wordlines and memory cells can be provided in a third dimension (within the page or above the page), within the scope of the present disclosure. The additional memory cells can define additional identifier bits, and in at least some aspects a subset of the additional memory cells can be aggregated with ReMEM cells 322, 324 to define a single identifier bit (e.g., four memory cells can define an identifier bit; eight memory cells can define an identifier bit, etc.). Other implementations known in the art or reasonably conveyed to one of ordinary skill in the art by way of the context provided herein are considered within the scope of the present disclosure.

Bitlines 312A, B can be selectively connected to or disconnected from a voltage source 350. In some embodiments, a transistor 352 and a separate transistor 354 can connect or disconnect bitline$_1$ 312A and bitline$_2$ 312B, respectively, to/from voltage source 350 (e.g., by way of a Viclamp transistor, in some embodiments). In other embodiments, bitlines 312A, B can be selectively connected to or disconnected from voltage source by a multiplexer, or other suitable switching circuit.

Figure 5:
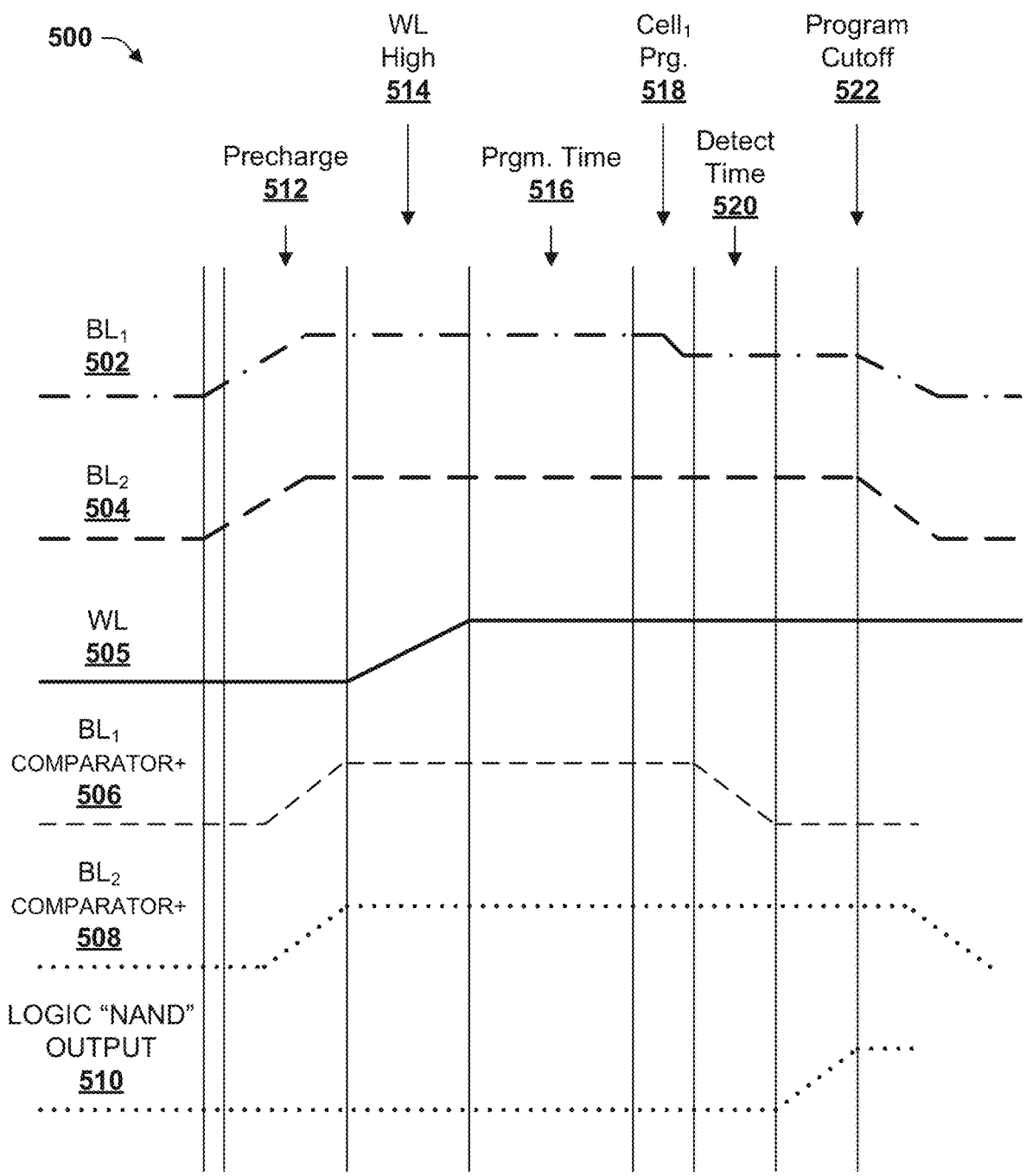
FIG. 5 illustrates a sample timing diagram for a differential program circuit including program detection and multi-path disablement, in another embodiment(s).

In one or more embodiments of the present disclosure, a memory controller (e.g., controller 120 of FIG. 1; one or more components of electronic environment 1100 of FIG. 11, infra, or the like) can connect bitlines 312A, B to voltage source 350, activate wordline 320 and apply a suitable program voltage to voltage source 350 to initiate a differential program process for ReMEM cells 322, 324 (e.g., see FIG. 5, infra). In this context, the program voltage can be applied concurrently (or substantially concurrently) across all of ReMEM cells 322, 324 defining an identifier bit. Moreover, the program voltage can be applied to voltage source 350 for a program cycle duration suitable to differential programming of ReMEM cells 322, 324. The program cycle duration, program voltage magnitude, number of pulses, pulse frequency, and so forth of the program voltage can be selected according to various design choices and as suitable for ReMEM cells 322, 324. Parameters for implementing the differential program can be stored in trim instructions 122, as noted throughout this specification.

In one embodiment, transistor 352 and transistor 354 can be PMOS transistors that are activated (conducting electricity along a channel) when their respective gate nodes are at low voltage. These nodes are in turn controlled by an output of a logic "NAND" circuit 342. Logic "NAND" circuit 342 outputs the low voltage in response to a bitline$_1$ comparator 334 and a bitline$_2$ comparator 332 measuring voltages at bitline$_1$ 312A and bitline$_2$ 312B, respectively, that are higher than a reverence voltage: vref. Moreover, a magnitude of vref and optionally of voltage source 350 (and circuit 300) can be selected to cause a voltage higher than vref to appear at respective inputs of bitline$_1$ comparator 334 and bitline$_2$ comparator 332 when ReMEM cells 322, 324 are unprogrammed (e.g., in a high resistance state(s)). Thus, while ReMEM cells 322, 324 remain unprogrammed, bitline comparators 332, 334 provide signals (as outputs) to logic "NAND" circuit 342 that maintain a low output at logic "NAND" circuit 342. As mentioned previously, this low output from logic "NAND" circuit 342 allows PMOS transistors 352, 354 to remain activated (electrically conducting). In response to ReMEM cell$_1$ 322 programming to a low resistance state, voltage on bitline$_1$ 312A reduces below vref, and bitline$_1$ comparator 334 changes its output. The new output from bitline$_1$ comparator 334 causes logic "NAND" 342 to output a high voltage, or termination output 344, which deactivates PMOS transistors 352, 354. Moreover, by deactivating PMOS transistors 352, 354, voltage source 350 is disconnected from bitlines 312A, B, reducing power consumption (since little to no current flows on the bitlines 312A, B) and avoiding subsequent programming of ReMEM cell$_2$ 324. Conversely, in response to ReMEM cell$_2$ 324 programming to the low resistance state, voltage on bitline$_2$ 312B reduces below vref, and the output of bitline$_2$ comparator 332 changes. This causes logic "NAND" circuit 342 to output the high voltage that deactivates PMOS transistors 352, 354 and disconnects bitlines 312A, B from voltage source 350, as above.

In an alternative embodiment(s), transistor 352 and transistor 354 can be NMOS transistors, and logic "NAND" circuit 342 can be replaced with an alternative circuit providing a high output when bitline comparators 332, 334 measure voltages higher than vref on bitline$_1$ 312A and bitline$_2$ 312B, as suitable. These NMOS transistors can be activated by a separate signal (from the logical "NAND" circuit 342 or other origin—not depicted) to connect voltage source 350 to bitlines 312A, B during a precharge phase (e.g., see FIG. 5, infra) to initiate the differential program process and allow charge (and voltage) to accumulate at bitlines 312A, B. This separate signal can be deactivated after bitlines 312A, B reach suitable program potential following the precharge phase and the alternative circuit provides the high output to the NMOS transistors (352, 354).

Circuit 300 can be designed to maintain voltages larger than vref at bitlines 312A, B when ReMEM cells 322, 324 are unprogrammed (e.g., in high resistance states). This design can include suitable resistance values 314A, 314B of bitlines 312A, B relative to the unprogrammed resistances of ReMEM cells 322, 324, suitable capacitance values 316A, 316B of bitlines 312A, B relative to the unprogrammed resistances of ReMEM cells 322, 324, or a suitable combination of the foregoing. In an embodiment, circuit 300 can be configured to have suitable combinations of relative resistance values 314A, 314B of bitlines 312A, B, resistance values of ReMEM cells 322, 324 in their low resistance states and resistance values of first transistor 326 and second transistor 328 of the switching circuit to maintain voltage higher than vref at bitlines 312A, B when ReMEM cells 322, 324 are unprogrammed, and to maintain voltage lower than vref at bitlines 312A, B when ReMEM cells 322, 324 are programmed, among other components of circuit 300.

When a duration of a program cycle for a differential program is complete, a controller 120 can remove program voltage from voltage source 350 (e.g., optionally turning off Viclamp transistor). Additionally, wordline 320 can go to low voltage deactivating first transistor 326 and second transistor 328. A read cycle can be implemented at ReMEM cells 322, 324 to determine which had programmed in response to the differential program. The identity of the programmed and unprogrammed cell can be compared with rules for digitizing the identifier bit, and a data value for the identifier bit determined.

In one or more embodiments, the programmed and unprogrammed states of ReMEM cells 322, 324 can be maintained to later determine (e.g., read) the identifier bit data value. In at least one embodiment, the programmed ReMEM cell can be reinforced to make the programmed cell non-erasable (e.g., reinforcement can include a one-time programmable program pulse). In an alternative embodiment(s), either the programmed ReMEM cell or the unprogrammed ReMEM cell can be designated as storing the data value of the identifier bit, and the other ReMEM cell can be re-allocated to other data, separate from (e.g., exclusive of) the identifier bit. As an example, the other ReMEM cell can be assigned to a second identifier bit, such as a second PUF bit 112, or a RNG bit 118, or can be re-characterized to an OTP memory cell 114 or an MTP memory cell 116. The ReMEM cell selected to store the data value can be either a cell matching a data value of the identifier bit (e.g., a programmed bit if the data value is '1' or an unprogrammed bit if the data value is '0'), or can be a cell inverse to the data value of the identifier bit (e.g., an unprogrammed bit if the data value is '1' or a programmed bit if the data value is '0'). Controller 120 can store an association between the designated ReMEM cell and the identifier bit, and whether the ReMEM cell represents the data value (matching the data value) or an inverse of the data value (inverse to the data value). The re-allocated ReMEM cell is not associated with the identifier bit, in this alternate embodiment(s). In still other embodiments, the data value of the identifier bit can be stored in other memory of array(s) 110 (e.g., OTP memory 114), and both ReMEM cells 322, 324 can be re-allocated to other data, such as a RNG (identifier) bit 118.

Figure 4:
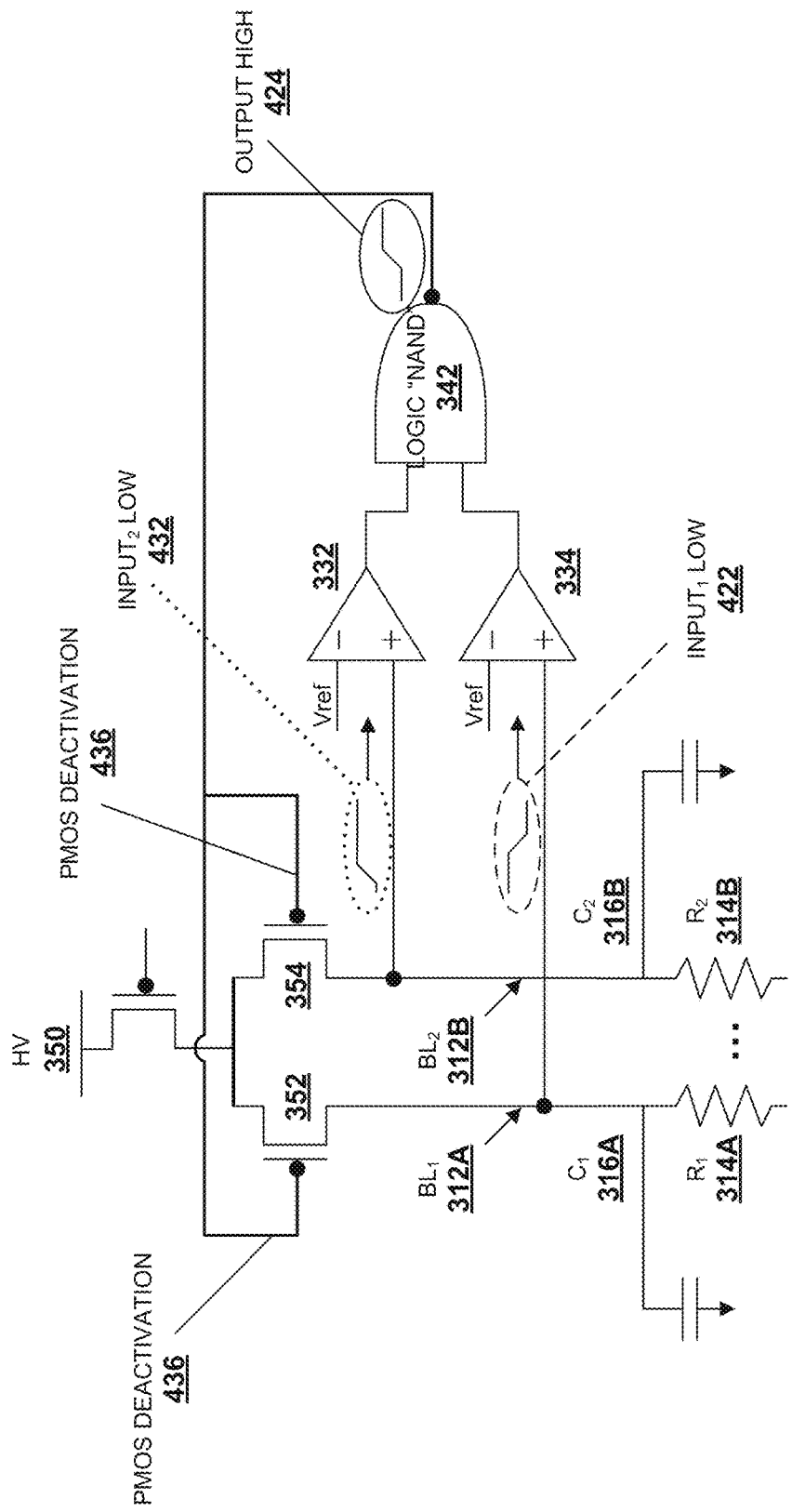
FIG. 4 depicts a schematic diagram of an example circuit to detect programming of one of multiple cells and disconnect the multiple cells from power, in an embodiment(s).

FIG. 4 illustrates a schematic diagram of an example program sensing and path isolation circuit 400, according to additional embodiments of the present disclosure. Circuit 400 includes a program detection circuit comprising bitline$_2$ comparator 332 and an input thereto that is connected to bitline$_2$ 312B, and comprising bitline$_1$ comparator 334 and an input thereto that is connected to bitline$_1$ 312A. A termination circuit comprises outputs from bitline comparators 332, 334 that are input to logic "NAND" circuit 342, and an output of logic "NAND" circuit 342 coupled to a bitline$_1$ transistor 352 and a bitline$_2$ transistor 354.

In the circuit 400, bitline$_1$ transistor 352 and bitline$_2$ transistor 354 are PMOS transistors, that are active when their gate nodes are low. When program voltage is applied at voltage source 350 (and Viclamp transistor activated) high voltage greater than vref appears on bitlines 312A, B. As a result, the outputs of bitline comparators 332, 334 maintain a low voltage at an output of logic "NAND" circuit 342. This low voltage maintains PMOS transistors 352, 354 in the activated (conductive) state.

The detection circuit is configured to monitor voltage on bitlines 312A, B for changes relative to vref. In response to a ReMEM cell connected to bitline$_2$ 312B becoming programmed to a low resistance state, the voltage input to bitline$_2$ comparator 334 goes from high voltage to low voltage: input$_1$ low 422 (dashed oval). Specifically, input$_1$ low 422 is below vref, changing an output at bitline$_2$ comparator 334. The output from bitline$_2$ comparator 334 is received at the termination circuit as an input to logic "NAND" circuit 342. This changes logic "NAND" 342 to output high 424, which becomes a PMOS deactivation signal 436 for transistors 352, 354. When deactivated, transistors 352, 354 disconnect voltage source 350 from bitlines 312A, B.

In response to a ReMEM cell connected to bitline$_1$ 312A becoming programmed to a low resistance state, the voltage input to bitline$_1$ comparator 332 goes from high voltage to low voltage: input$_2$ low 432 (dotted oval). Specifically, input$_2$ low 422 is below vref, changing an output at bitline$_1$ comparator 332. The changed output is received at the termination circuit as an input to logic "NAND" circuit 342, which changes logic "NAND" 342 to output high 424. As stated above, output high 424 serves as a PMOF deactivation signal 436 for transistors 352, 354 to disconnect voltage source 350 from bitlines 312A, B.

It should be understood that time to detect a program event on bitline$_1$ 312A is proportional to resistance R$_1$ 314A and capacitance C$_1$ 316A of bitline$_1$ 312A and charge dissipated on bitline$_1$ 312A in response to the program event. Likewise, time to reduce voltage in response to deactivation of PMOS transistor 352 is also proportional to R$_1$ 314A and C$_1$ 316A. Similarly, time to detect a program event on bitline$_2$ 312B is proportional to resistance R$_2$ 314B and capacitance C$_2$ 316B of bitline$_2$ 312B and charge dissipated in response to the program event. Time to reduce voltage in response to deactivation of PMOS transistor 354 is also proportional to R$_2$ 314B and C$_2$ 316B.

FIG. 4A illustrates an example of a circuit 400A facilitating differential program sensing and adjacent cell termination according to further embodiments of the present disclosure. Circuit 400A includes a pull-down circuit 460A coupled between an output of logic "NAND" 342 and bitline$_2$ 312B and a pull-down circuit 470A coupled between the output of logic "NAND" 342 and bitline$_1$ 312A. Pull-down circuits 470A, 460A are configured to rapidly suppress voltage on bitlines 312A, B respectively to overcome long RC time delays in discharging bitlines 312A, B in response to disconnection from voltage source 350 at PMOS transistors 352, 354. Pull-down circuit 460A includes an NMOS transistor 462A having a gate coupled to an output node logic "NAND" 342, and one channel node (e.g., a source or drain) coupled to bitline$_2$ 312B and a second channel node (e.g., a drain or source, respectively) coupled to ground 464A. In response to the output of logic "NAND" 342 going high providing a NMOS activation signal 436A, NMOS transistor 462A is activated connecting bitline$_2$ 312B to ground 464A. Likewise, pull-down circuit 470A includes an NMOS transistor 472A having a gate coupled to an output node of logic "NAND" 342, and one channel node (e.g., a source or drain) coupled to bitline 312A and a second channel node (e.g., drain or source, respectively) coupled to ground 474A, which can more rapidly discharge bitline$_1$ 312A than merely disconnecting bitline$_1$ 312A from power supply 350. In response to the output of logic "NAND" 342 going high providing the NMOS activation 436A, NMOS transistor 472A is activated connecting bitline$_1$ 312A to ground 474A, which can more rapidly discharge bitline$_1$ 312A than merely disconnecting from power supply 350.

FIG. 5 depicts a graph 500 of timing diagrams for a differential program operation utilizing circuit 300, according to further embodiments of the present disclosure. Graph 500 illustrates voltage (vertical axis) versus time (horizontal axis) for the following nodes of circuit 300: bitline$_1$ (BL1) 502, bitline$_2$ (BL2) 504, wordline (WL) 505, bitline$_1$ comparator (BL1 Comp) 506, bitline$_2$ comparator (BL2 Comp) 508 and logic "or" output (OR out) 510.

At the start of a differential program operation, a precharge phase 512 is initiated in which BL1 502 and BL2 504 are connected to supply voltage, and charge on the bitlines increases. At the end of precharge phase 512, voltage on BL1 502 and BL2 504 peak and a wordline high phase 514 begins where voltage on WL 505 increases. Once wordline high phase 514 ends, the voltage on WL 505 activates transistors 326, 328 and connects ReMEM cells 322, 324 to low voltage (or ground), initiating a program phase 516. During program phase 516 ReMEM cell$_1$ 322 programs (in the embodiment depicted by FIG. 5) initiating a cell$_1$ program phase 518, in which voltage on BL1 502 decreases to a moderate voltage. A detect time phase 520 occurs after which voltage output by BL1 Comp 506 goes high, causing OR Out 510 to increase to high voltage. When OR Out 510 reaches high voltage, a program cutoff phase 522 occurs, draining voltage from BL1 502 and BL2 504. Note that BL2 Comp 508 does not need to change for OR Out 510 to increase in the depicted embodiment.

As described at FIG. 4, supra, time for increase in charge at BL1 502 and BL2 504, reduction in charge on BL1 502 in response to a program event, and discharge of BL1 502 and BL2 504 are proportional to resistance and capacitance of the respective bitlines. A time to detect a program event can be about 0.5 a microsecond (µs) or about 500 nanoseconds (ns) in various embodiments, or a range of 350 ns to 650 ns, for example. A total time to detect the program event, disconnect BL1 502 and BL2 504 from voltage source 350 and discharge BL1 502 and BL2 504 (thereby removing the program voltage from an unprogrammed memory cell) can be from about 1 µs to about 1.5 µs for common bitline resistance and capacitance values. In some embodiments, local bitlines having far shorter length can be utilized in a disclosed two-terminal memory array (e.g., array(s) 110 of FIG. 1, supra, bitlines 312A, B of FIG. 3 or of FIG. 6, array 1102 of FIG. 11, infra, and so forth) to significantly reduce the time delay involved in detecting the program event and discharging the bitlines. For instance, times of about 100 ns to about 150 ns could be possible for an array(s) 110 comprising local bitlines.

While program cutoff phase 522 can generally occur before a program cycle associated with the differential program is complete—reducing total power consumption for the program cycle, and reducing a likelihood that both memory cells program before being disconnected from power—program cutoff phase 522 cannot completely eliminate a possibility that both memory cells program. Additional embodiments of the present disclosure are configured to intrinsically suppress voltage of a non-programmed cell in response to programming of another cell. This intrinsic voltage suppression can be very rapid: e.g., less than 20 ns, a range from 10 ns to 20 ns, less than 10 ns, a range from 5 ns to 10 ns, are within the scope of the present disclosure. This intrinsic suppression of voltage at the non-programmed memory cell can greatly reduce the likelihood of invalid data results for differential programming of an identifier bit comprising a plurality of two-terminal memory cells.

Figure 6:
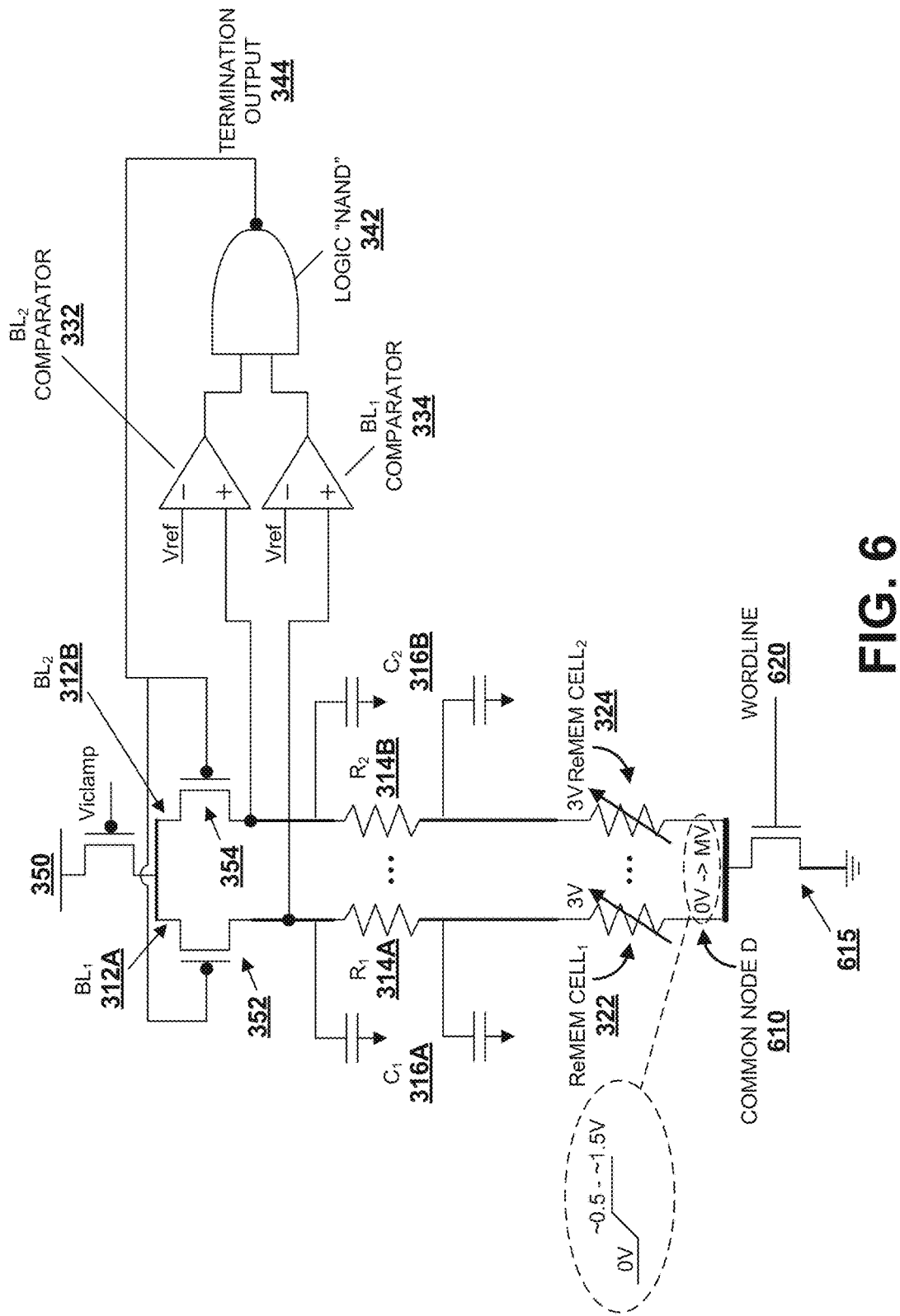
FIG. 6 depicts an example schematic diagram of an example circuit for differential program with intrinsic program suppression and multi path disablement.

FIG. 6 depicts a schematic diagram of an example differential program sensing and termination circuit 600 with intrinsic voltage suppression, according to further embodiments of the present disclosure. In various embodiments, elements of circuit 600 numbered the same as elements in FIG. 3 can be substantially similar to the descriptions provided for circuit 300 of FIG. 3, supra, including alternative embodiments, except where described differently below. Circuit 600 can be configured to implement a differential program process for a plurality of two-terminal memory cells. In addition, circuit 600 can be configured to detect a program event for one memory cell (or a first group of memory cells) of the plurality of memory cells, and disconnect the memory cells from supply voltage. This reduces overall power consumption associated with the differential program process. Moreover, circuit 600 can suppress voltage across an unprogrammed cell (or group of unprogrammed cells) in response to a detected memory cell (or group of memory cells) becoming programmed. This voltage suppression can be intrinsic and local to the memory cell(s), and can occur very rapidly and before supply voltage discharges in response to disconnecting the memory cells from the supply voltage. Voltage suppression below 20 ns, below 10 ns, or in a range from 5 ns to 10 ns is possible according to circuit models. As a result, circuit 600 can significantly mitigate or avoid unexpected program events leading to invalid identifier data values, as described herein.

Circuit 600 includes ReMEM cells 322, 324 similar to circuit 300 of FIG. 3, supra. Additionally, first terminals of ReMEM cells 322, 324 are connected to bitline$_1$ 312A and bitline$_2$ 312B, respectively, and selectively connected to (or disconnected from) voltage supply 350 by way of transistor 352 and transistor 354 (and optionally a Viclamp transistor). (In some embodiments, however, transistors 352, 354 can be replaced with a multiplexer, or other suitable switching circuit responsive to termination output 344 of logic "NAND" 342). Second terminals of ReMEM cells 322, 324 are coupled together (electrically shorted) at a common node D 610. Common node D 610 is selectively connectable to or dis-connectable from low voltage, or ground, by a switching circuit. In the embodiment of FIG. 6, the switching circuit can include a transistor 615 coupled at a gate node thereof to wordline 620, though in other embodiments transistor 615 can be replaced with a multiplexer or other suitable switch.

In response to a program voltage supplied at voltage source 350 (and Viclamp transistor being activated) and wordline 620 activating transistor 615, the program voltage (or approximately the program voltage) appears across ReMEM cells 322, 324 concurrently. A detection circuit including: bitline$_1$ comparator 334 having an input coupled to bitline$_1$ 312A, and bitline$_2$ comparator 332 having an input coupled to bitline$_2$ 332 monitors voltage at bitlines 312A, B relative to a reference voltage. In response to voltage across a bitline dropping below vref, logic "NAND"

circuit 342 provides a termination output 344 that deactivates transistors 352, 354 as described herein.

In contrast to circuit 300, in response to one of ReMEM cells 322, 324 becoming programmed common node D 610 increases rapidly from low voltage to a moderate voltage (e.g., about 0.5 volts to about 1.5 volts). Because common node D 610 is shared for second terminals of both ReMEM $cell_1$ 322 and ReMEM $cell_2$ 324, common node D 610 increasing to the moderate voltage (MV) effectively reduces a program voltage (Vprog) appearing across an unprogrammed cell, approximately by the moderate voltage. In other words, the voltage across the unprogrammed memory cell can be: Vprog−MV, and can be lower than required to program the unprogrammed memory cell to a low resistance state. Accordingly, the moderate voltage at common node D 610 suppresses a voltage at ReMEM $cell_1$ 322, for example, in response to ReMEM $cell_2$ 324 becoming programmed. This can greatly mitigate or even avoid programming of both memory cells, and therefore avoid an invalid data result for an identifier bit comprising ReMEM $cell_1$ 322 and ReMEM $cell_2$ 324.

As shown, intrinsic suppression of program voltage across the second memory cell can be implemented in conjunction with detecting a program event and disconnecting voltage source 350 from bitlines 312A, B in response to detecting the program event. This both reduces overall power consumption of the differential program process, and greatly mitigates or even avoids unexpected program results for the differential program process. Accordingly, circuit 600 achieves a significant advantage for differential programming of an identifier bit.

Figure 6A:
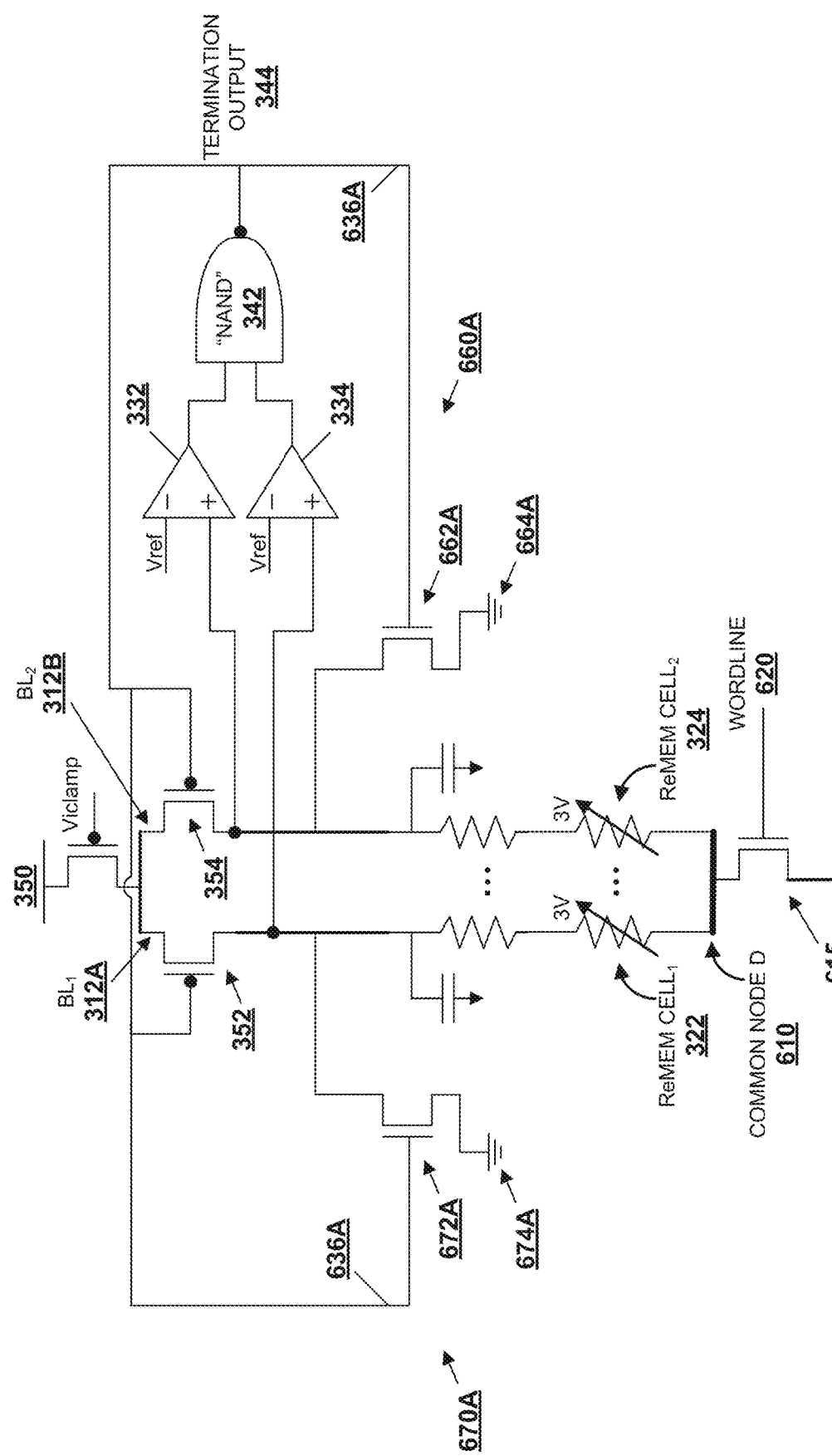
FIG. 6A illustrates a schematic diagram of an example circuit for differential program, intrinsic suppression and bitline pull-down according to one or more embodiments.

FIG. 6A illustrates an example of a circuit 600A facilitating differential program sensing and adjacent cell termination according to further embodiments of the present disclosure. Circuit 600A includes a pull-down circuit 660A coupled between an output of logic "NAND" 342 and $bitline_2$ 312B and a pull-down circuit 670A coupled between the output of logic "NAND" 342 and $bitline_1$ 312A. Pull-down circuits 670A, 660A are configured to rapidly suppress voltage on bitlines 312A, B respectively to overcome long RC time delays in discharging bitlines 312A, B in response to disconnection from voltage source 350 at PMOS transistors 352, 354. Pull-down circuit 660A includes an NMOS transistor 662A having a gate coupled to an output node of logic "NAND" 342, and one channel node (e.g., a source or drain) coupled to $bitline_2$ 312B and a second channel node (e.g., a drain or source, respectively) coupled to ground 664A. In response to the output of logic "NAND" 342 going high providing a NMOS activation signal 636A, NMOS transistor 662A is activated connecting $bitline_2$ 312B to ground 664A. Likewise, pull-down circuit 470A includes an NMOS transistor 672A having a gate coupled to an output node of logic "NAND" 342, and one channel node (e.g., a source or drain) coupled to $bitline_1$ 312A and a second channel node (e.g., drain or source, respectively) coupled to ground 674A, which can more rapidly discharge $bitline_1$ 312A than merely disconnecting $bitline_1$ 312A from power supply 350. In response to the output of logic "NAND" 342 going high providing the NMOS activation 636A, NMOS transistor 672A is activated connecting $bitline_1$ 312A to ground 674A, which can more rapidly discharge $bitline_1$ 312A than merely disconnecting from power supply 350.

Figure 7:
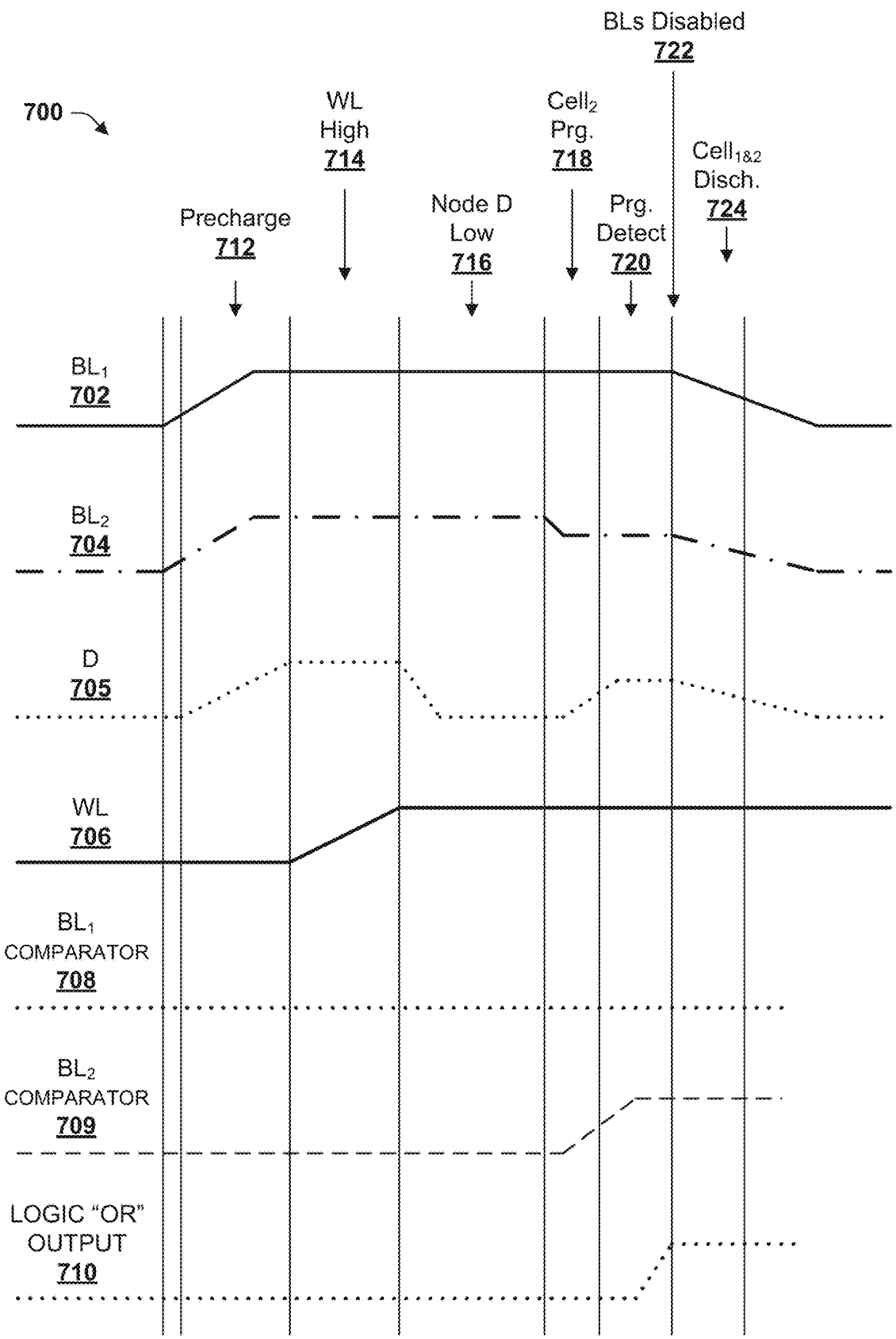
FIG. 7 illustrates an example timing diagram for the differential program circuit with intrinsic program suppression of FIG. 6, in further embodiments.

FIG. 7 depicts a graph 700 of timing diagrams for a differential program operation utilizing circuit 600, according to further embodiments of the present disclosure. Graph 700 illustrates voltage (vertical axis) versus time (horizontal axis) for the following nodes of circuit 600: $bitline_1$ (BL1) 702, $bitline_2$ (BL2) 704, common node D (D) 705, wordline (WL) 706, $bitline_1$ comparator (BL1 Comp) 708, $bitline_2$ comparator (BL2 Comp) 709 and logic "or" output (OR out) 710.

At the start of a differential program operation, a precharge phase 712 is initiated in which BL1 702 and BL2 704 are connected to a program voltage provided at voltage source 350, and charge on the bitlines and on D 705 increases. At the end of precharge phase 712, voltages on D 705, BL1 702 and BL2 704 peak and a wordline high phase 714 begins where voltage on WL 706 increases. Once wordline high phase 714 ends, the voltage on WL 706 activates transistor 615 and connects common node D 705 and second terminals of ReMEM cells 322, 324 to low voltage (or ground). Voltage on D 705 decreases to low voltage when transistor 615 is activated, initiating a node D low phase 716 (also referred to as a program phase) in which (approximately) the program voltage appears across ReMEM cells 322, 324. During node D low phase 716 ReMEM $cell_2$ 324 programs (in the embodiment depicted by FIG. 7) to a low resistance state, initiating a $cell_2$ program phase 718. The low resistance state of ReMEM $cell_2$ 324 pulls up the voltage at D 705 to a moderate voltage and decreases voltage on BL2 702. Because second terminals of ReMEM cells 322, 324 are electrically shorted at common node D 610, voltage across BL1 702 drops in response to voltage at D 705 increasing. A program detect phase 520 occurs as input to $bitline_2$ comparator drops relative to vref, and the output BL2 Comp 709 rises. Bitlines 312A, B become disabled 722 (disconnected from voltage source 350) once OR out 710 is high. This initiates a $cell_{1\&2}$ discharge phase 124 that begins draining voltage from BL1 702 and BL2 704.

Note that BL1 Comp 708 does not need to change for OR Out 710 to increase in the depicted embodiment. Moreover, the bitline disable 722 and $cell_{1\&2}$ discharge phase 124 can occur prior to completion of a program cycle for the differential program operation and while a program voltage is still applied at supply source 350. However, because transistors 352, 354 are deactivated in response to OR Out 710 having high voltage, bitlines 312A, B are disconnected from supply source 350 and therefore the program voltage discharges from bitlines 312A, B as illustrated by FIG. 7. Voltage response of common node D 610 rapidly suppresses program voltage at the non-programmed memory cell (ReMEM $cell_1$ 322 in the embodiment illustrated by FIG. 7), mitigating or avoiding invalid data results for the differential program operation. Further, disabling bitlines in response to detecting the programming of ReMEM $cell_2$ 324 can further ensure against programming of both memory cells, and furthermore can reduce power consumed during the differential program process once bitlines 312A, B are disconnected from voltage source 350.

The diagrams included herein are described with respect to several circuits, controllers, and arrays of resistive switching devices or an integrated circuit device(s) comprising multiple circuits, controllers, or arrays. It should be appreciated that such diagrams can include those circuits, controllers, etc., specified therein, some of the specified circuits/controllers/arrays, or additional circuits/controllers/arrays not explicitly depicted but known in the art or reasonably conveyed to those of skill in the art by way of the context provided herein. Components of disclosed integrated circuit devices can also be implemented as sub-components of another disclosed component (e.g., input 140 and output 150 can be sub-components of controller 120), whereas other components disclosed as sub-components can be separate components in various embodiments (e.g., PUF bits 112, OTP bits 114, MTP bits 116 and RNG bits 118 can be separate arrays as opposed to portions of array(s) 110). Further, embodiments within a particular Figure of the present specification can be applied in part or in whole to other embodiments depicted in other Figures without limitation, subject only to suitability to achieving a disclosed function or purpose as understood by one of skill in the art, and vice versa. As illustrative (and non-limiting) examples, array control circuitry 124 of FIG. 1 can be embodied by bitline comparators 332, 334, logic "NAND" circuit 342 and transistors 352, 354 of FIG. 3 or 6; array 220 of FIG. 2 can be incorporated within circuit 300 of FIG. 3 or circuit 600 of FIG. 6; array(s) 110 of resistive switching memory cells as depicted in FIG. 1 can be populated with differential PUF bits 202 or array 220; array(s) 110 can be operably coupled with controller 120 as depicted or with controller 120 and some or all array control components of FIG. 11 (e.g., row control 1104, sense amps 1108, column control 1106, clock source(s) 1110, address register 1114, reference and control signal(s) generator 1118, state machine 1120, input/output buffer 1112, command interface 1116), or substituted for memory array 1102 of FIG. 11, or volatile memory 1210A or non-volatile memory 1210B of FIG. 12, or suitable components of operating and control environment 1100 or environment 1200 can be substituted or added to other components or integrated circuit devices disclosed herein, and so forth. Additionally, it is noted that one or more disclosed processes can be combined into a single process providing aggregate functionality. For instance, a write process can comprise a read-verify process, or vice versa, to facilitate storing data at memory or generating data within memory and reading that stored/generated data, by way of a single process. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 8-10A. While for purposes of simplicity of explanation, the methods of FIGS. 8-10A are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein can be implemented as part of a disclosed method within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methods to an electronic device, stored in embedded memory within the electronic device, and so forth. The term article of manufacture, as used, is intended to encompass a computer program accessible from any computer-readable device, device in conjunction with a carrier, or storage medium, or the like.

Figure 8:
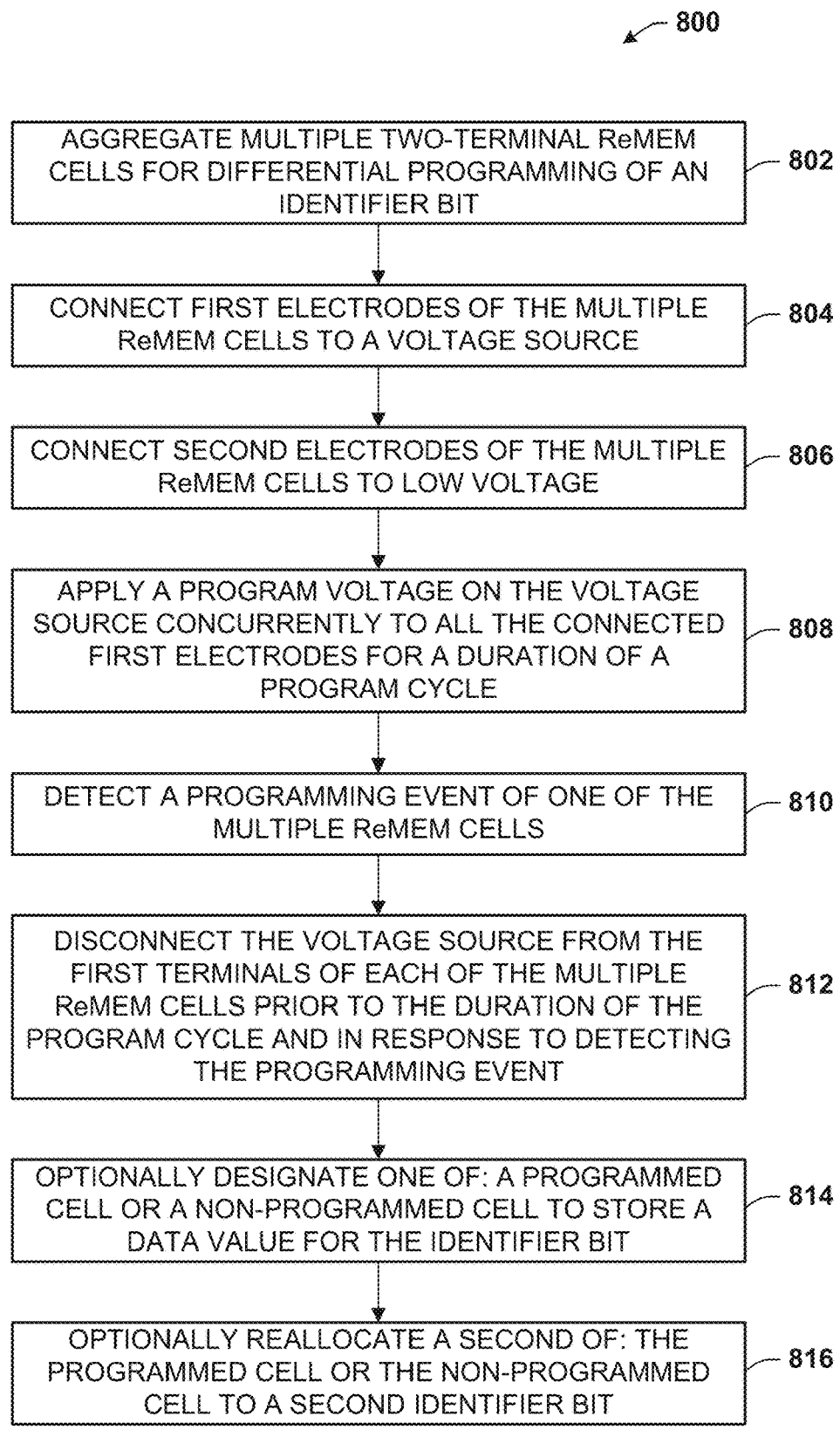
FIG. 8 illustrates a flowchart of an example method for providing differential program for an identifier bit defined by multiple memory cells, in an embodiment(s).

Referring now to FIG. 8, there is illustrated a flowchart of an example method 800 according to alternative or additional embodiments of the present disclosure. As an example, method 800 can comprise a method for programming a plurality of two-terminal resistive switching memory cells that define an identifier bit.

According to various embodiments, at 802, method 800 can optionally comprise aggregating multiple two-terminal memory cells for differential programming of an identifier bit. The two-terminal memory cells can comprise resistive switching memory cells, such as filamentary resistive switching devices, RRAM® devices, PCRAM devices, CBRAM® devices, PMC devices, MRAM devices, STT-MRAM devices, VMRAM devices, FeRAM devices, among other suitable technologies.

At 804, method 800 can comprise connecting a first terminal of the first two-terminal resistive switching memory cell to a voltage source by way of a first switch. Additionally, method 800 can comprise connecting a first terminal of a second two-terminal memory cell to the voltage source by way of a second switch. In one or more embodiments, the first two-terminal memory cell and the second two-terminal memory cell define an identifier bit.

At 806, method 800 can comprise connecting second terminals of the first two-terminal memory cell and of the second two-terminal memory cell to low voltage. At 808, method 800 can comprise applying a program voltage at the voltage source for a duration of a program cycle, and at 810, method 800 can comprise detecting a program event for the first two-terminal memory cell or for the second two-terminal memory cell. Furthermore, at 812, method 800 can comprise opening the first switch and opening the second switch to disconnect the first two-terminal memory cell and the second two-terminal memory cell from the voltage source in response to detecting the program event and before completing the duration of the program cycle. In an embodiment, method 800 can additionally comprise activating a pull-down circuit to couple to ground respective bitlines connected to the first terminal of the first two-terminal resistive switching memory cell and to the second terminal of the first two-terminal resistive switching memory cell in response to detecting the programming event. Still further, at 814, method 800 can optionally comprise maintaining the program voltage at the voltage source for the duration of the program cycle.

In some embodiments, method 800 can further comprise removing the program voltage from the voltage source upon completing the duration of the program cycle and after the opening of the first switch and opening of the second switch. In an alternative embodiment, the program voltage can be removed from the voltage source in response to opening the first switch and opening the second switch and before completing the duration of the program cycle.

In a further embodiment(s), method 800 can comprise designating a first memory cell of a group consisting of: the first two-terminal memory cell and the second two-terminal memory cell as representing a data value for the identifier bit in response to the program event. Method 800 can optionally comprise re-allocating a second memory cell of the group consisting of: the first two-terminal memory cell and the second two-terminal memory cell for additional data that excludes the identifier bit, where the first memory cell and the second memory cell are different memory cells (i.e., not the same memory cell). The additional data can be a PUF bit 112 or a RNG bit 118 that is separate from (and excludes) the identifier bit, or can be an OTP bit 114 or MTP bit 116 in various embodiments.

In yet additional embodiments, the first terminal of the first two-terminal memory cell can be connected to the first switch by a first bitline, and the first terminal of the second two-terminal memory cell can be connected to the second switch by a second bitline. Additionally, detecting the program event can further comprise measuring a change in voltage with respect to a reference voltage (e.g., a drop in voltage below the reference voltage, or a rise above in voltage above the reference voltage in alternative embodiments) on the first bitline, or a change in voltage with respect to the reference voltage on the second bitline following connecting the second terminals to the low voltage and applying the program voltage at the voltage source. Method 800 can further comprise generating a termination output to deactivate the first switch and the second switch in response to the change in voltage dropping below (or rising above) the threshold voltage.

In another embodiment(s), connecting the second terminals to low voltage can further comprise activating a third switch that serves as a common node and that electrically shorts a second terminal of the first two-terminal memory cell with a second terminal of the second two-terminal memory cell, and can comprise connecting the common node to low voltage (or ground). Additionally, the method 800 can comprise in response to applying the program voltage one of: intrinsically suppressing a voltage across the second two-terminal memory cell in response to the program event occurring for the first two-terminal memory cell; or intrinsically suppressing a voltage across the first two-terminal memory cell in response to the program event occurring for the second two-terminal memory cell.

In an alternative embodiment, connecting the second terminals to low voltage further comprises activating a third switch that couples a second terminal of the first two-terminal memory cell to the low voltage, and activating a fourth switch that couples a second terminal of the second two-terminal memory cell to the low voltage. In this alternative embodiment, the third switch can provide a first electrical path to the low voltage (or ground) for the second terminal of the first two-terminal memory cell that is electrically isolated from a second electrical path to the low voltage (or ground) provided by the fourth switch for the second terminal of the second two-terminal memory cell.

According to further embodiments, the identifier bit can be a PUF bit, the first two-terminal memory cell is a first native memory cell having never been programmed, and the second two-terminal memory cell is a second native memory cell having never been programmed. Additionally, the program cycle can be configured to cause either the first two-terminal memory cell to become programmed, or to cause the second two-terminal memory cell to become programmed. In still further embodiments, method 800 can comprise determining a binary value of the PUF bit in response to whether the first two-terminal memory cell becomes programmed or the second two-terminal memory cell becomes programmed.

Figure 9:
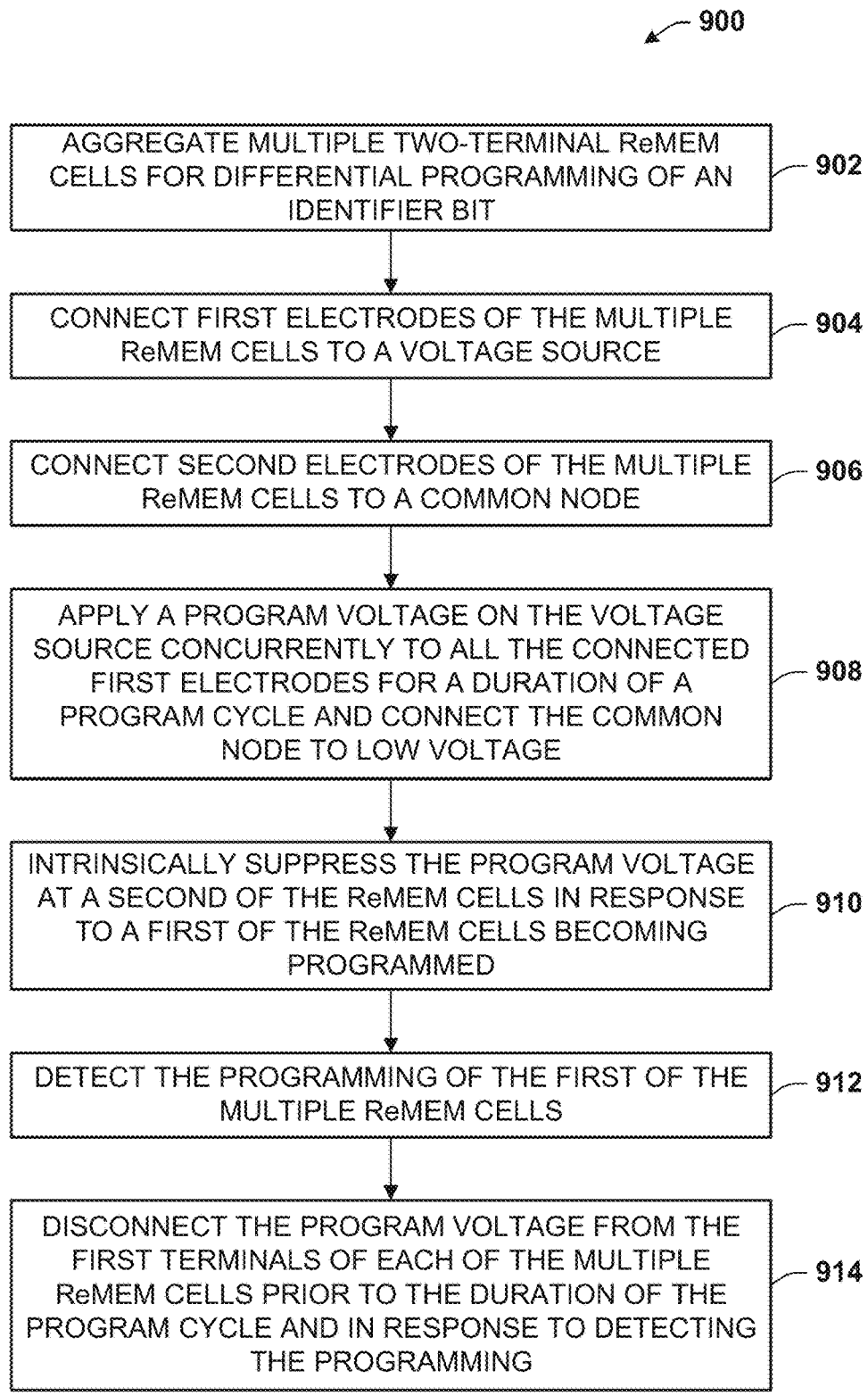
FIG. 9 depicts a flowchart of a sample method for differential programming with intrinsic suppression, program detection and multi path disablement, in an embodiment.

FIG. 9 illustrates a flowchart of a sample method 900 for programming a plurality of two-terminal resistive switching memory cells. At 902, method 900 can comprise aggregating multiple two-terminal resistive switching memory cells for differential programming of an identifier bit. At 904, method 900 can comprise connecting first terminals of the plurality of two-terminal resistive switching memory cells to a voltage source, and at 906, method 900 can comprise connecting second terminals of the plurality of two-terminal resistive switching memory cells to a low voltage, or ground.

At 908, method 900 can comprise applying a program voltage at the voltage source concurrently for all of the plurality of two-terminal resistive switching memory cells for a duration of the program cycle. In addition to the foregoing, at 910, method 900 can comprise detecting a programming event for one of the plurality of two-terminal resistive switching memory cells, and at 912, method 900 can comprise disconnecting the voltage source from the first terminals of the plurality of two-terminal resistive switching memory cells in response to detecting the programming event and before the duration of the program cycle. In one or more embodiments, method 900 can further comprise activating a pull-down circuit to couple to ground first terminals of the plurality of two-terminal resistive switching memory cells in response to detecting the programming event.

According to one or more additional embodiments, method 800 can comprise designating the one of the plurality of two-terminal resistive switching memory cells having the programming event to store a data value for the data bit defined by the plurality of the two-terminal resistive switching memory cells. Additionally, method 800 can comprise re-allocating a second of the plurality of two-terminal resistive switching memory cells not having the programming event to other data exclusive of the data bit.

In an alternative embodiment, method 800 can comprise designating a second of the plurality of two-terminal resistive switching memory cells not having the programming event to store a data value for the data bit defined by the plurality of the two-terminal resistive switching memory cells. In such embodiment, method 800 can further comprise re-allocating the one of the plurality of two-terminal resistive switching memory cells having the programming event to other data exclusive of the data bit. The other data can comprise a second identifier bit—for example a second PUF bit 112 or a RNG bit 118—or can comprise an OTP bit 114 or MTP bit 116, in various embodiments.

According to still further embodiments, the plurality of two-terminal resistive switching memory cells comprises a first memory cell and a second memory cell. Method 800 can comprise connecting the first terminal of the first memory cell to a bitline and to a first switch that, when closed, electrically connects the first terminal of the first memory cell to the voltage source. Additionally, method 800 can comprise connecting the first terminal of the second memory cell to a second bitline and to a second switch that, when closed, electrically connects the first terminal of the second memory cell to the voltage source. Second terminals of the first memory cell and of the second memory cell can be electrically shorted at a common node, and the common node can be connected to the low voltage, or ground. In still further embodiments, detecting the programming event further comprises detecting a reduction in a voltage on the bitline or a reduction in a second voltage on the second bitline, and disconnecting the voltage source from the first terminals of the plurality of two-terminal resistive switching memory cell can further comprise opening the first switch and opening the second switch.

Figure 10:
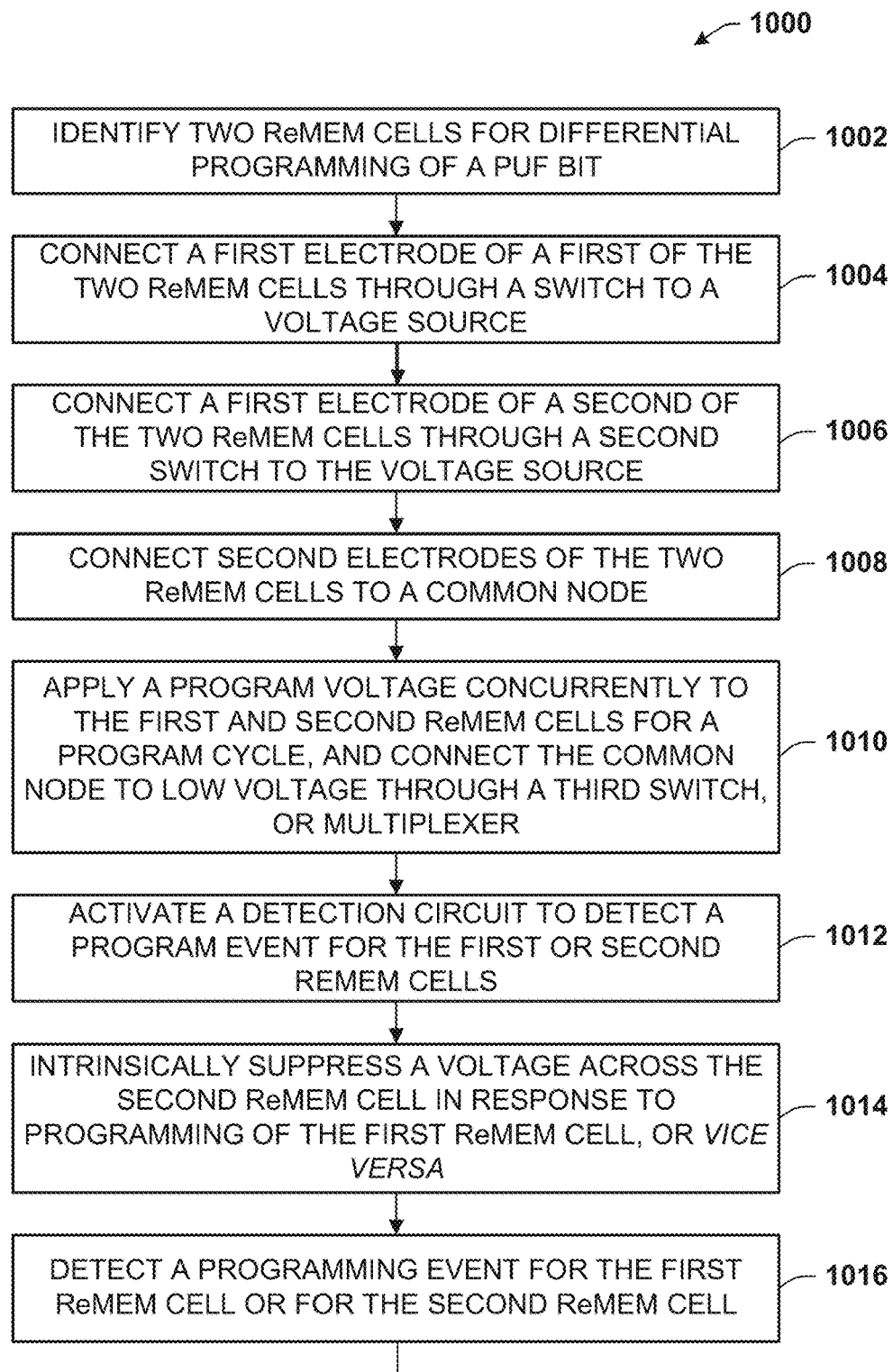
FIGS. 10 and 10A illustrate a method for differential program according to still further embodiments of the present disclosure.
Figure 10A:
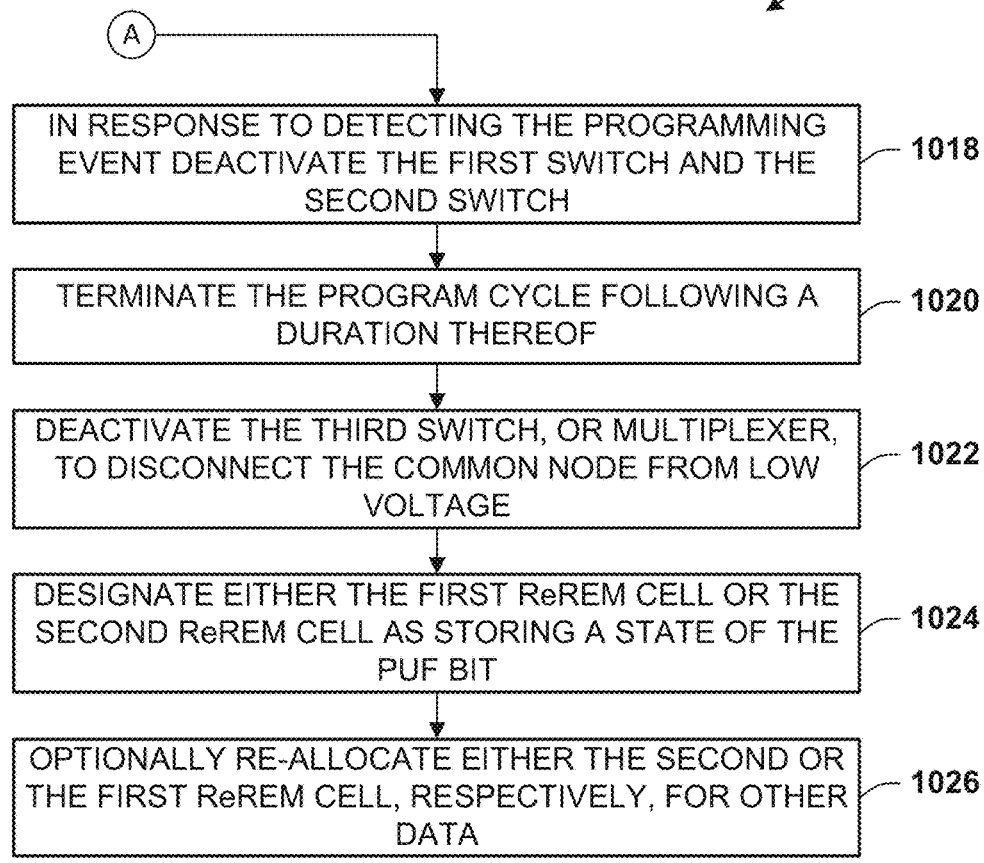

FIGS. 10 and 10A illustrate a flowchart of an example method 1000 according to still further embodiments of the present disclosure. At 1002, method 1000 can comprise identifying two ReMEM cells for differential programming of a PUF bit. At 1004, method 1000 can comprise connecting a first electrode of a first of the two ReMEM cells through a switch to a voltage source, and at 1006, method 1000 can comprise connecting a first electrode of a second of the two ReMEM cells through a second switch to the voltage source. At 1008, method 1000 can comprise connecting second electrodes of the two ReMEM cells to a common node.

At 1010, method 1000 can comprise applying a program voltage concurrently to the first and second ReMEM cells for a program cycle, and connecting the common node to low voltage through a third switch, or multiplexer. At 1012, method 1000 can comprise activating a detection circuit to detect a program event for the first or second ReMEM cells. At 1014, method 1000 can comprise intrinsically suppressing a voltage across the second ReMEM cell in response to programming of the first ReMEM cell, or vice versa.

At 1016, method 1000 can comprise detecting a programming event for the first ReMEM cell or for the second ReMEM cell. From 1016, method 1000 can proceed to FIG. 10A, at 1018.

Referring to FIG. 10A, at 1018, method 1000 can comprise deactivating the first switch and the second switch in response to detecting the programming event. At 1020, method 1000 can comprise terminating the program cycle following a duration thereof and, at 1022, method 1000 can comprise deactivating the third switch, or multiplexer, to disconnect the common node from low voltage. At 1024, method 1000 can comprise designating either the first ReMEM cell or the second ReMEM cell as storing a state of the PUF bit. In addition to the foregoing, at 1026, method 1000 can optionally comprise re-allocating either the second ReMEM cell or the first ReMEM cell, respectively, for other data (e.g., data exclusive of the PUF bit).

Example Operating Environments

FIG. 11 illustrates a block diagram of an example operating and control environment 1100 for a memory array 1102 of a memory device according to aspects of the subject disclosure. Control environment 1100 and memory array 1102 can be formed within a single semiconductor die in some embodiments, although the subject disclosure is not so limited and in other embodiments some components of control environment 1100 can be formed on a separate semiconductor die. In at least one aspect of the subject disclosure, memory array 1102 can comprise memory selected from a variety of memory cell technologies. In at least one embodiment, memory array 1102 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1106 and sense amps 1108 can be formed adjacent to memory array 1102. Moreover, column controller 1106 can be configured to activate (or identify for activation) a subset of bit lines of memory array 1102. Column controller 1106 can utilize a control signal(s) provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines of memory array 1102. Also utilizing control signals of reference and control signal generator(s) 1118, row controller 1104 can select one or more rows of memory cells with a suitable selection voltage. Moreover, row controller 1104 can facilitate program, erase or read operations by applying suitable voltages at selected word lines.

Sense amps 1108 can read data from, or write data to, the activated memory cells of memory array 1102, which are selected by column control 1106 and row control 1104. Data read out from memory array 1102 can be provided to an input/output buffer 1112. Likewise, data to be written to memory array 1102 can be received from the input/output buffer 1112 and written to the activated memory cells of memory array 1102.

A clock source(s) 1110 can provide respective clock pulses to facilitate timing for read, write, and program operations of row controller 1104 and column controller 1106. Clock source(s) 1110 can further facilitate selection of word lines or bit lines in response to external or internal commands received by operating and control environment 1100. Input/output buffer 1112 can comprise a command and address input, as well as a bidirectional data input and output. Instructions are provided over the command and address input, and the data to be written to memory array 1102 as well as data read from memory array 1102 is conveyed on the bidirectional data input and output, facilitating connection to an external host apparatus, such as a computer or other processing device (not depicted, but see e.g., computer 1202 of FIG. 12, infra).

Input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1114. In addition, input data is transmitted to memory array 1102 via signal input lines between sense amps 1108 and input/output buffer 1112, and output data is received from memory array 1102 via signal output lines from sense amps 1108 to input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus and determine whether data input to the input/output buffer 1112 is write data, a command, or an address. Input commands can be transferred to a state machine 1120.

State machine 1120 can be configured to manage programming and reprogramming of memory array 1102 (as well as other memory banks of a multi-bank memory array). Instructions provided to state machine 1120 are implemented according to control logic configurations, enabling state machine 1120 to manage read, write, erase, data input, data output, and other functionality associated with memory cell array 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1110 or reference and control signal generator(s) 1118. Control of clock source(s) 1110 can cause output pulses configured to facilitate row controller 1104 and column controller 1106 implementing the particular functionality.

Output pulses can be transferred to selected bit lines by column controller 1106, for instance, or word lines by row controller 1104, for instance.

Figure 12:
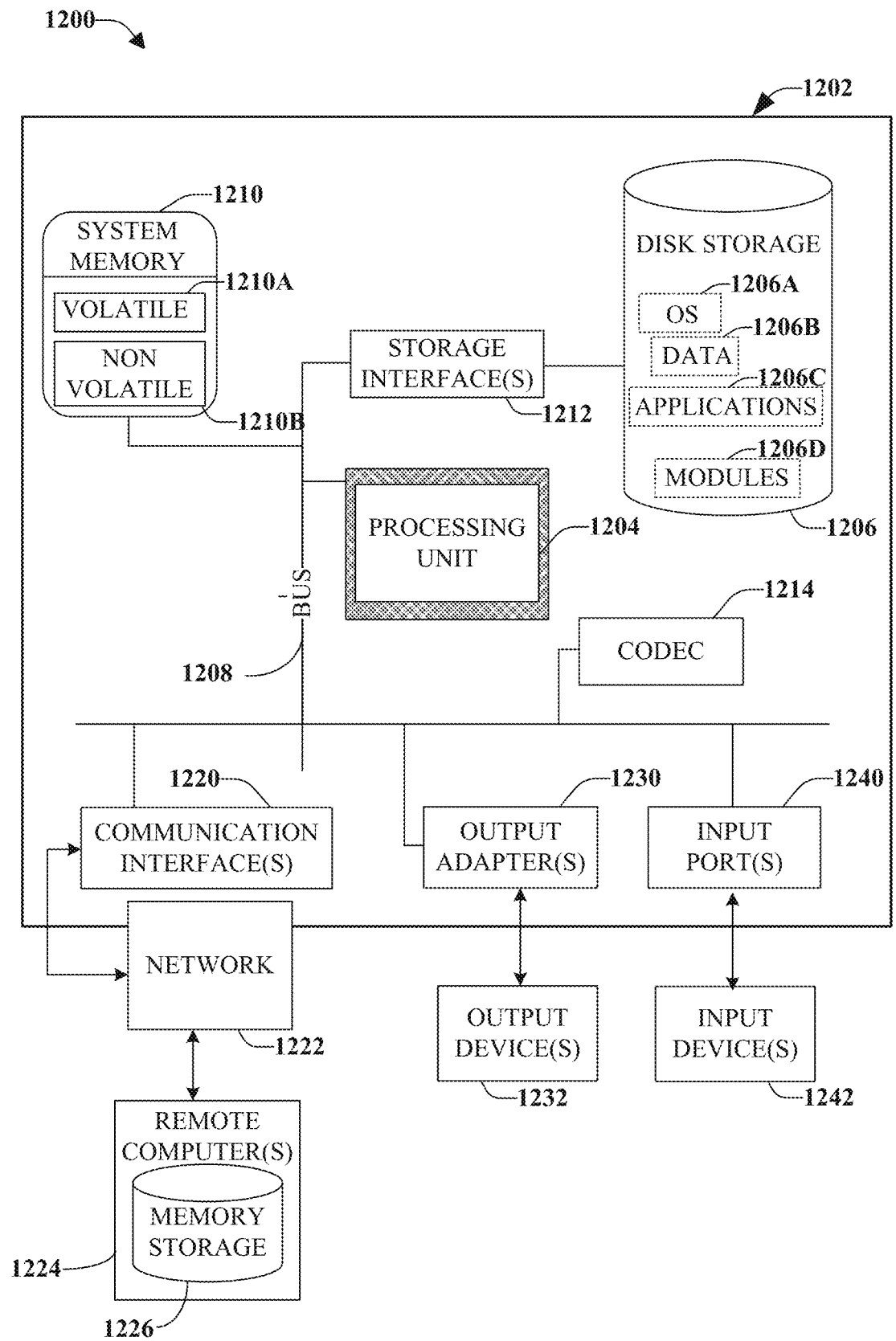
FIG. 12 illustrates a block diagram of an example computing environment for implementing one or more embodiments of the present disclosure.

In connection with FIG. 12, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 12, a suitable environment 1200 for implementing various aspects of the claimed subject matter includes a computer 1202. The computer 1202 includes a processing unit 1204, a system memory 1210, a codec 1214, and a system bus 1208. The system bus 1208 couples system components including, but not limited to, the system memory 1210 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1210 includes volatile memory 1210A and non-volatile memory 1210B. The basic input/output system (BIOS), containing the basic routines to transfer information between elements within the computer 1202, such as during start-up, is stored in non-volatile memory 1210B. In addition, according to present innovations, codec 1214 may include at least one of an encoder or decoder, wherein the at least one of an encoder or decoder may consist of hardware, software, or a combination of hardware and software. Although, codec 1214 is depicted as a separate component, codec 1214 may be contained within non-volatile memory 1210B. By way of illustration, and not limitation, non-volatile memory 1210B can include read only memory (ROM), programmable ROM (PROM), electrically programmable ROM (EPROM), electrically erasable programmable ROM (EEPROM), or flash memory, two-terminal memory, and so on. Volatile memory 1210A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1202 may also include removable/non-removable, volatile/non-volatile computer storage medium. FIG. 12 illustrates, for example, disk storage 1206. Disk storage 1206 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1206 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1206 to the system bus 1208, a removable or non-removable interface is typically used, such as storage interface 1212. It is appreciated that storage devices 1206 can store information related to a user. Such information might be stored at or provided to a server or to an application running on a user device. In one embodiment, the user can be notified (e.g., by way of output device(s) 1232) of the types of information that are stored to disk storage 1206 or transmitted to the server or application. The user can be provided the opportunity to opt-in or opt-out of having such information collected and/or shared with the server or application (e.g., by way of input from input device(s) 1242).

It is to be appreciated that FIG. 12 describes software that acts as an intermediary between users and the basic computer resources described in the suitable operating environment 1200. Such software includes an operating system 1206A. Operating system 1206A, which can be stored on disk storage 1206, acts to control and allocate resources of the computer system 1202. Applications 1206C take advantage of the management of resources by operating system 1206A through program modules 1206D, and program data 1206D, such as the boot/shutdown transaction table and the like, stored either in system memory 1210 or on disk storage 1206. It is to be appreciated that the claimed subject matter can be implemented with various operating systems or combinations of operating systems.

A user enters commands or information into the computer 1202 through input device(s) 1242. Input devices 1242 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via input port(s) 1240. Input port(s) 1240 include, for example, a serial port, a parallel port, a game port, and a universal serial bus (USB). Output device(s) 1232 use some of the same type of ports as input device(s) 1242. Thus, for example, a USB port may be used to provide input to computer 1202 and to output information from computer 1202 to an output device 1232. Output adapter 1230 is provided to illustrate that there are some output devices 1232 like monitors, speakers, and printers, among other output devices 1232, which require special adapters. The output adapters 1230 include, by way of illustration and not limitation, video and sound cards that provide a means of connection between the output device 1232 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1224. The remote computer(s) 1224 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1226 is illustrated with remote computer(s) 1224. Remote computer(s) 1224 is logically connected to computer 1202 through a network 1222 and then connected via communication interface(s) 1220. Network 1222 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1220 refers to the hardware/software employed to connect the network 1222 to the bus 1208. While communication interface(s) 1220 is shown for illustrative clarity inside computer 1202, it can also be external to computer 1202. The hardware/software necessary for connection to the network 1222 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g., 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for programming a plurality of two-terminal resistive switching memory devices that define an identifier bit, comprising:
   connecting a first terminal of a first two-terminal resistive switching memory cell to a voltage source by way of a first switch;
   connecting a first terminal of a second two-terminal resistive switching memory cell to the voltage source by way of a second switch, wherein the first two-terminal resistive switching memory cell and the second two-terminal resistive switching memory cell define an identifier bit;
   connecting second terminals of the first two-terminal resistive switching memory cell and of the second two-terminal resistive switching memory cell to low voltage;
   apply a program voltage at the voltage source for a duration of a program cycle;
   detecting a program event for the first two-terminal resistive switching memory cell or for the second two-terminal resistive switching memory cell; and
   opening the first switch and opening the second switch to disconnect the first two-terminal resistive switching memory cell and the second two-terminal resistive switching memory cell from the voltage source in response to detecting the program event and before completing the duration of the program cycle.

2. The method of claim 1, further comprising removing the program voltage from the voltage source upon completing the duration of the program cycle and after the opening the first switch and opening the second switch.

3. The method of claim 1, further comprising designating a first memory cell of a group consisting of: the first two-terminal resistive switching memory cell and the second two-terminal resistive switching memory cell as representing a data value for the identifier bit in response to the program event.

4. The method of claim 3, further comprising re-allocating a second memory cell of the group consisting of: the first two-terminal resistive switching memory cell and the second two-terminal resistive switching memory cell for additional data that excludes the identifier bit, wherein the first memory cell is not the same as the second memory cell.

5. The method of claim 1, wherein the first terminal of the first two-terminal resistive switching memory cell is connected to the first switch by a first bitline, and wherein the first terminal of the second two-terminal resistive switching memory cell is connected to the second switch by a second bitline, and further wherein detecting the program event further comprises measuring a reduction in voltage below a reference voltage on the first bitline or a reduction in voltage below the reference voltage on the second bitline following connecting the second terminals to the low voltage and applying the program voltage at the voltage source.

6. The method of claim 1, wherein connecting the second terminals to low voltage further comprises:
activating a third switch that serves as a common node and electrically shorts a second terminal of the first two-terminal resistive switching memory cell with a second terminal of the second two-terminal resistive switching memory cell;
connecting the common node to the low voltage; and
in response to applying the program voltage, one of:
intrinsically suppressing a voltage across the second two-terminal resistive switching memory cell in response to the program event occurring for the first two-terminal resistive switching memory cell; or
intrinsically suppressing a voltage across the first two-terminal resistive switching memory cell in response to the program event occurring for the second two-terminal resistive switching memory cell.

7. The method of claim 1, wherein connecting the second terminals to low voltage further comprises:
activating a third switch that couples a second terminal of the first two-terminal resistive switching memory cell to the low voltage; and
activating a fourth switch that couples a second terminal of the second two-terminal resistive switching memory cell to the low voltage, wherein the third switch and the fourth switch provide separate electrically isolated electrical paths to the low voltage for the second terminal of the first two-terminal resistive switching memory cell and for the second terminal of the second two-terminal resistive switching memory cell, respectively.

8. The method of claim 1, wherein:
the identifier bit is a physical unclonable feature (PUF) bit;
the first two-terminal resistive switching memory cell is a first native memory cell having never been programmed to a low resistance state;
the second two-terminal resistive switching memory cell is a second native memory cell having never been programmed to a low resistance state; and
the program cycle is configured to cause either the first two-terminal resistive switching memory cell to become programmed or to cause the second two-terminal resistive switching memory cell to become programmed.

9. The method of claim 8, further comprising: determining a binary value of the PUF bit in response to whether the first two-terminal resistive switching memory cell becomes programmed or the second two-terminal resistive switching memory cell becomes programmed.

10. A method for programming a data bit defined by a plurality of two-terminal resistive switching memory cells, comprising:
connecting first terminals of the plurality of two-terminal resistive switching memory cells to a voltage source;
connecting second terminals of the plurality of two-terminal resistive switching memory cells to a low voltage, or ground;
applying a program voltage at the voltage source concurrently for all of the plurality of two-terminal resistive switching memory cells for a duration of a program cycle;
detecting a programming event for one of the plurality of two-terminal resistive switching memory cells; and
disconnect the voltage source from the first terminals of the plurality of two-terminal resistive switching memory cells in response to detecting the programming event and before the duration of the program cycle.

11. The method of claim 10, further comprising designating the one of the plurality of two-terminal resistive switching memory cells having the programming event to store a data value for the data bit defined by the plurality of the two-terminal resistive switching memory cells.

12. The method of claim 11, further comprising re-allocating a second of the plurality of two-terminal resistive switching memory cells not having the programming event to other data exclusive of the data bit.

13. The method of claim 10, further comprising designating a second of the plurality of two-terminal resistive switching memory cells not having the programming event to store a data value for the data bit defined by the plurality of the two-terminal resistive switching memory cells.

14. The method of claim 13, further comprising re-allocating the one of the plurality of two-terminal resistive switching memory cells having the programming event to other data exclusive of the data bit.

15. The method of claim 10, wherein:
the plurality of two-terminal resistive switching memory cells comprises a first memory cell and a second memory cell;
a first terminal of the first memory cell is connected to a bitline and to a first switch that, when closed, electrically connects the first terminal of the first memory cell to the voltage source;
a first terminal of the second memory cell is connected to a second bitline and to a second switch that, when closed, electrically connects the first terminal of the second memory cell to the voltage source;
the second terminals of the first memory cell and of the second memory cell are electrically shorted at a common node, and the common node is connected to the low voltage, or ground;
detecting the programming event further comprises detecting a reduction in a voltage on the bitline or a reduction in a second voltage on the second bitline; and
wherein disconnecting the voltage source from the first terminals of the plurality of two-terminal resistive switching memory cells further comprises opening the first switch and opening the second switch.

16. An integrated circuit device, comprising:
an array of two-terminal resistive switching memory cells, the array further comprising:
a first two-terminal resistive switching memory cell having a first terminal and a second terminal;
a second two-terminal resistive switching memory cell having a first terminal and a second terminal;
a first bitline electrically connected to the first terminal of the first two-terminal resistive switching memory cell;
a second bitline electrically connected to the first terminal of the second two-terminal resistive switching memory cell;

a switching circuit electrically coupled to the second terminal of the second two-terminal resistive switching memory cell and to the second terminal of the first two-terminal resistive switching memory cell; and a wordline for selectively activating or deactivating the switching circuit;

a voltage source selectively coupled to the first bitline through a first transistor and to the second bitline through a second transistor;

a low voltage, or ground selectively coupled with the second terminal of the second two-terminal resistive switching memory cell and with the second terminal of the first two-terminal resistive switching memory cell in response to activation of the switching circuit by the wordline;

array control circuitry configured to detect a change in voltage on the first bitline or a change in voltage on the second bitline in comparison to a reference voltage; and an array controller, wherein the array controller is configured to:

define the first two-terminal resistive switching memory cell and the second two-terminal resistive switching memory cell as a single identifier bit;

implement a differential program for the single identifier bit;

detect a program event at the first bitline or at the second bitline utilizing the array control circuity in response to the differential program; and disconnect the first bitline and the second bitline from the voltage source in response to detecting the program event.

17. The integrated circuit device of claim 16, further comprising trim memory storing a process for the differential program, wherein the process comprises:

activate the first transistor and the second transistor to electrically connect the first bitline and the second bitline to the voltage source;

activate the switching circuit by way of the wordline to electrically connect the low voltage, or ground, to the second terminal of the first two-terminal resistive switching memory cell and to the second terminal of the second two-terminal resistive switching memory cell;

apply a program voltage at the voltage source; and in response to detecting the program event, deactivate both the first transistor and the second transistor to disconnect the first bitline and the second bitline from the voltage source.

18. The integrated circuit device of claim 17, wherein deactivating the first transistor and the second transistor occurs prior to completion of a cycle duration of the differential program.

19. The integrated circuit device of claim 16, wherein the switching circuit comprises a common node that electrically shorts the second terminal of the second two-terminal resistive switching memory to the second terminal of the first two-terminal resistive switching memory, wherein activation of the switching circuit by the wordline connects the common node to low voltage, or ground.

20. The integrated circuit device of claim 16, wherein the switching circuit comprises:

a first switch that electrically couples the second terminal of the first two-terminal resistive switching memory cell to the low voltage, or ground, via a first electrical path in response to activation of the switching circuit by the wordline; and a second switch that electrically couples the second terminal of the second two-terminal resistive switching memory cell to the low voltage, or ground, via a second electrical path in response to activation of the switching circuit by the wordline.

* * * * *